US012484287B2

(12) United States Patent
Choe et al.

(10) Patent No.: US 12,484,287 B2
(45) Date of Patent: Nov. 25, 2025

(54) FERROELECTRIC MATERIAL, AND ELECTRONIC DEVICE INCLUDING THE SAME

(71) Applicant: Samsung Electronics Co., Ltd., Suwon-si (KR)

(72) Inventors: Dukhyun Choe, Suwon-si (KR); Jinseong Heo, Suwon-si (KR); Yunseong Lee, Osan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 436 days.

(21) Appl. No.: 17/945,528

(22) Filed: Sep. 15, 2022

(65) Prior Publication Data

US 2023/0107911 A1 Apr. 6, 2023

(30) Foreign Application Priority Data

Sep. 17, 2021 (KR) ........................ 10-2021-0125248

(51) Int. Cl.
*H10D 64/68* (2025.01)
*C30B 29/16* (2006.01)
(Continued)

(52) U.S. Cl.
CPC ........... *H10D 64/689* (2025.01); *C30B 29/16* (2013.01); *H10B 51/30* (2023.02); *H10B 53/30* (2023.02);
(Continued)

(58) Field of Classification Search
CPC .. H10D 64/689; H10D 30/0415; H10D 30/43; H10D 30/6211; H10D 30/6735;
(Continued)

(56) References Cited

U.S. PATENT DOCUMENTS

2002/0125515 A1 9/2002 Joo et al.
2020/0055134 A1 2/2020 Heo et al.
(Continued)

FOREIGN PATENT DOCUMENTS

EP 4 008 810 A2 6/2022
KR 10-0379245 B1 3/2003
(Continued)

OTHER PUBLICATIONS

Extended European Search Report dated Feb. 3, 2023 issued in European Patent Application No. 22195832.5-1103.
Choe, et al. "Unexpectedly low barrier of ferroelectric switching in HfO2 via topological domain walls," Materials Today, Elsevier, No. 50, pp. 8-15, XP086893934 (2021).
Hyun-Jae Lee et al., "Scale-free ferroelectricity induced by flat phonon bands in HfO2," Science 369, pp. 1343-1347 (2020).
Takashi Maeda et al, "Identifying Ferroelectric Switching Pathways in HfO2: First Principles Calculations Under Electric Fields" IEEE, pp. 1-4 (2017).
(Continued)

*Primary Examiner* — Earl N Taylor
(74) *Attorney, Agent, or Firm* — Harness, Dickey & Pierce, P.L.C.

(57) ABSTRACT

Provided are a ferroelectric material and an electronic device including same, the ferroelectric material including: a first domain including a first polarization layer which is polarized in a first direction and a first spacer layer disposed adjacent to the first polarization layer; a second domain including a second polarization layer which is polarized in a second direction distinct from the first direction and a second spacer layer disposed adjacent to the second polarization layer; and a structural layer, which is disposed at a domain wall between the first domain and the second domain, and belongs to/has atoms arranged according to a Pbcn space group.

36 Claims, 19 Drawing Sheets

DW
D1
D2
STL
SL
PL1
PL2

(51) Int. Cl.

| | |
|---|---|
| ***H10B 51/30*** | (2023.01) |
| ***H10B 53/30*** | (2023.01) |
| ***H10D 1/68*** | (2025.01) |
| ***H10D 30/00*** | (2025.01) |
| ***H10D 30/01*** | (2025.01) |
| ***H10D 30/62*** | (2025.01) |
| ***H10D 30/69*** | (2025.01) |
| ***H10D 62/10*** | (2025.01) |

(52) U.S. Cl.
CPC ....... *H10D 30/0415* (2025.01); *H10D 30/501* (2025.01); *H10D 30/6211* (2025.01); *H10D 30/701* (2025.01); *C01P 2002/76* (2013.01); *H10D 1/68* (2025.01); *H10D 62/121* (2025.01)

(58) Field of Classification Search
CPC ........... H10D 30/6739; H10D 30/6757; H10D 30/701; H10D 62/121; H10D 30/6755; H10D 1/68; H10D 30/47; H10D 30/60; H10D 62/80; H10D 62/882; H10D 64/033; H10D 30/67; H10D 30/68; H10D 30/6891; C01G 27/02; H10B 51/10; H10B 51/30; H10B 53/30; H10B 41/30; C01P 2002/30; C01P 2002/76; C01P 2006/40; B82Y 10/00; C30B 1/023; C30B 29/16
See application file for complete search history.

(56) References Cited

U.S. PATENT DOCUMENTS

| | | | | |
|---|---|---|---|---|
| 2020/0230873 | A1 | 7/2020 | Moore et al. | |
| 2021/0143250 | A1* | 5/2021 | Lee .......................... | H10D 1/68 |
| 2022/0169530 | A1 | 6/2022 | Choe et al. | |
| 2023/0062878 | A1 | 3/2023 | Heo et al. | |

FOREIGN PATENT DOCUMENTS

| | | |
|---|---|---|
| KR | 10-2022-0077051 A | 6/2022 |
| KR | 10-2023-0030549 A | 3/2023 |

OTHER PUBLICATIONS

Weitong Ding et al., "The atomic-scale domain wall structure and motion in HfO2-based ferroelectrics: A first-principle study," Acta Materialia, vol. 196, pp. 556-564 (2020).

Tran Doan Huan et al., "Pathways towards ferroelectricity in hafnia," Physical Review B, vol. 90, pp. 064111-1-064111-5 (2014).

Ping-Ping Shi et al., "Symmetry breaking in molecular ferroelectrics," Chem. Soc. Rev., 45, pp. 3811-3827 (2016).

Noe Mascello et al, "Theoretical investigation of twin boundaries in WO3: Structure, properties, and implications for superconductivity," Physical Review Research 2, 033460-1-033460-17, (2020).

* cited by examiner

FERROELECTRIC MATERIAL, AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0125248, filed on Sep. 17, 2021, in the Korean Intellectual Property Office, the disclosure of which is incorporated by reference herein in its entirety.

BACKGROUND

Some example embodiments relate to a ferroelectric material, and/or an electronic device including the same.

Semiconductor devices such as memory devices and/or transistors are used in various household and industrial devices. According to the high performance of household and industrial devices, high integration and/or miniaturization of semiconductor devices are progressing.

Therefore, various forms of semiconductor devices have been proposed. For example, a semiconductor device employing a dielectric layer including a ferroelectric material has been proposed. Domain inversion may occur in a ferroelectric material, and thus, using such properties, ferroelectric materials are applicable to various semiconductor devices. As ferroelectric materials, a perovskite-based ferroelectric material and a fluorite-based ferroelectric material are known.

SUMMARY

A ferroelectric material having a fluorite structure is low in domain inversion rate since the magnitude of the energy barrier that must be crossed in domain inversion is high. For example, in existing ferroelectric materials having the fluorite structure, the magnitude of the energy barrier when domain inversion occurs is two times or more compared to that of perovskite-based ferroelectric materials. Therefore, there is a need or a desire for a novel fluorite-based ferroelectric material with increased domain inversion speed due to a reduction in the magnitude of the energy barrier when domain inversion occurs, compared to the fluorite-based ferroelectric material of the related art.

One or more example embodiments include a ferroelectric material, which includes a structural layer having a novel symmetric structure, and thus, the magnitude of an energy barrier when domain inversion occurs is reduced/significantly reduced.

One or more example embodiments include an electronic device including the ferroelectric material.

Additional aspects will be set forth in part in the description which follows and, in part, will be apparent from the description, or may be learned by practice of various example embodiments.

According to one or more example embodiments, provided is a ferroelectric material including a first domain including a first polarization layer which is configured to be polarized in a first direction and a spacer layer adjacent to the first polarization layer, a second domain including a second polarization layer which is configured to be polarized in a second direction distinct from the first direction and a spacer layer adjacent to the second polarization layer, and a structural layer, which is at a domain wall between the first domain and the second domain.

According to one or more example embodiments, provided is a ferroelectric material including a first domain including a first polarization layer which is configured to be polarized in a first direction and a spacer layer adjacent to the first polarization layer, a second domain including a second polarization layer which is configured to be polarized in a second direction distinct from the first direction and a spacer layer adjacent to the second polarization layer, and a structural layer, which is at a domain wall between the first domain and the second domain, the structural layer being arranged (e.g. having atoms arranged) according to a Pbcn space group.

According to one or more example embodiments, provided is an electronic device including the ferroelectric material described above.

According to one or more example embodiments, provided is a ferroelectric material including a first domain including a first polarization layer configured to be polarized in a first direction and a spacer layer adjacent to the first polarization layer, and a structural layer at a domain wall between the first domain and a second domain, the structural layer having metal atoms and oxygen atoms, the metal atoms and the oxygen atoms arranged as a Pbcn space group.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF VARIOUS EXAMPLE EMBODIMENTS

Figure 1:
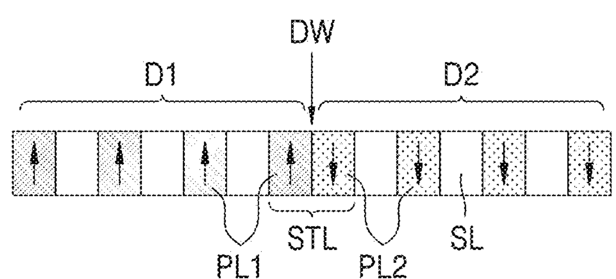
FIG. 1 is a schematic view showing a structure of a ferroelectric material according to some example embodiments.

Reference will now be made in detail to various embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Some example embodiments will now be described more fully with reference to the accompanying drawings, in which example embodiments are shown. Various example embodiments may, however, be embodied in many different forms, should not be construed as being limited to example embodiments set forth herein, and should be construed as including all modifications, equivalents, and alternatives within the scope of example embodiments; rather, various embodiments are provided so that this disclosure will be thorough and complete, and will fully convey the effects and features of example embodiments and ways to implement the disclosure to those of ordinary skill in the art.

The terminology used herein is for the purpose of describing particular embodiments only and is not intended to be limiting of some example embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the slash "/" or the term "and/or" includes any and all combinations of one or more of the associated listed items.

In the drawings, the size or thickness of each layer, region, or element are arbitrarily exaggerated or reduced for better understanding or ease of description, and thus some example embodiments is not limited thereto. Throughout the written description and drawings, like reference numbers and labels will be used to denote like or similar elements. It will also be understood that when an element such as a layer, a film, a region, or a component is referred to as being "on" another layer or element, it can be "directly on" the other layer or element, or intervening layers, regions, or components may also be present. Although the terms "first", "second", etc., may be used herein to describe various elements, components, regions, and/or layers, these elements, components, regions, and/or layers should not be limited by these terms. These terms are used only to distinguish one component from another, not for purposes of limitation. In the following description and drawings, constituent elements having substantially the same functional constitutions are assigned like reference numerals, and overlapping descriptions will be omitted.

As used herein, the term "domain wall (DW)", which is a region among a plurality of domains, means or refers to or corresponds to a region including, for example, zero unit cells to five unit cells.

As used herein, the expression "arranged at a domain wall" or "arranged at the domain wall" means or refers to or corresponds to an arrangement to include part or all of the domain wall.

Hereinafter, example embodiments of a ferroelectric material and/or an electronic device including the same will be described in greater detail.

A ferroelectric material according to one or more example embodiments includes: a first domain including a first polarization layer, which is polarized in or is configured to be polarized a first direction, and a spacer layer disposed adjacent to the first polarization layer; a second domain including a second polarization layer, which is polarized in or is configured to be polarized in a second direction distinct from the first direction, and a spacer layer disposed adjacent to the second polarization layer; and a structural layer, which is disposed at a domain wall between the first domain and the second domain and belongs to a Pbcn space group. As used herein, when a material is described as belonging to a specific space group, this is to be construed as the atomic structure of the material has atoms arranged according to the particular space group.

In the ferroelectric material including, at the domain wall, the structural layer which belongs to/has atoms arranged according to the Pbcn space group, when an external electric field is applied to the ferroelectric material, while a symmetric structure of the structural layer at the domain wall between the first domain and the second domain changes according to a direction in which the electric field is applied, a change in the direction of polarization of the structural layer may occur. Due to the change in polarization direction of the structural layer, a domain inversion occurs. Consequently, the domain wall propagates. Due to repeated propagations of the domain wall, a polarization direction of the first domain and/or second domain changes as a whole. Due to the arrangement of the structural layer, which belongs to or has atoms arranged according to the Pbcn space group, at the domain wall of the ferroelectric material, the magnitude of the energy barrier when domain inversion occurs is reduced. Accordingly, the propagation speed at the domain wall in the ferroelectric material increases, and the operation speed of an electronic device including the ferroelectric material becomes faster.

FIG. 1 is a schematic view showing a domain wall (DW) of a ferroelectric material according to various example embodiments.

Referring to FIG. 1, a ferroelectric material according to various example embodiments includes a first domain D1 including a first polarization layer PL1, which is polarized in a first direction, and a spacer layer SL disposed adjacent to the first polarization layer PL1, and a second domain D2 including a second polarization layer PL2, which is polarized in a second direction distinct from the first direction, and a spacer layer SL disposed adjacent to the second polarization layer PL2. A structural layer STL, which belongs to or has atoms arranged according to a Pbcn space group, is arranged at a domain wall DW between the first domain D1 and the second domain D2. The structural layer STL included in the ferroelectric material may have, for example, an orthorhombic crystal structure. Accordingly, the structural layer STL included in the ferroelectric material may include an orthorhombic crystalline phase which belongs to/has atoms arranged according to the Pbcn space group. As the structural layer STL arranged at the domain wall of the ferroelectric material includes an orthorhombic crystalline phase which belongs to a Pbcn space group, the magnitude of the energy barrier when domain inversion or a polarization direction change occurs may be reduced.

Referring to FIG. 1, the structural layer STL may include, for example, the first polarization layer PL1 and the second polarization layer PL2. The first polarization layer PL1 and the second polarization layer PL2 may be sequentially arranged along one direction. The first polarization layer PL1 and the second polarization layer PL2 may be arranged to contact, e.g. to directly contact each other. For example, the spacer layer SL may not be present between the first polarization layer PL1 and the second polarization layer PL2. As the structural layer STL included in the ferroelectric material has such a structure, the magnitude of the energy barrier when domain inversion or polarization direction change occurs may reduce.

Figure 2:
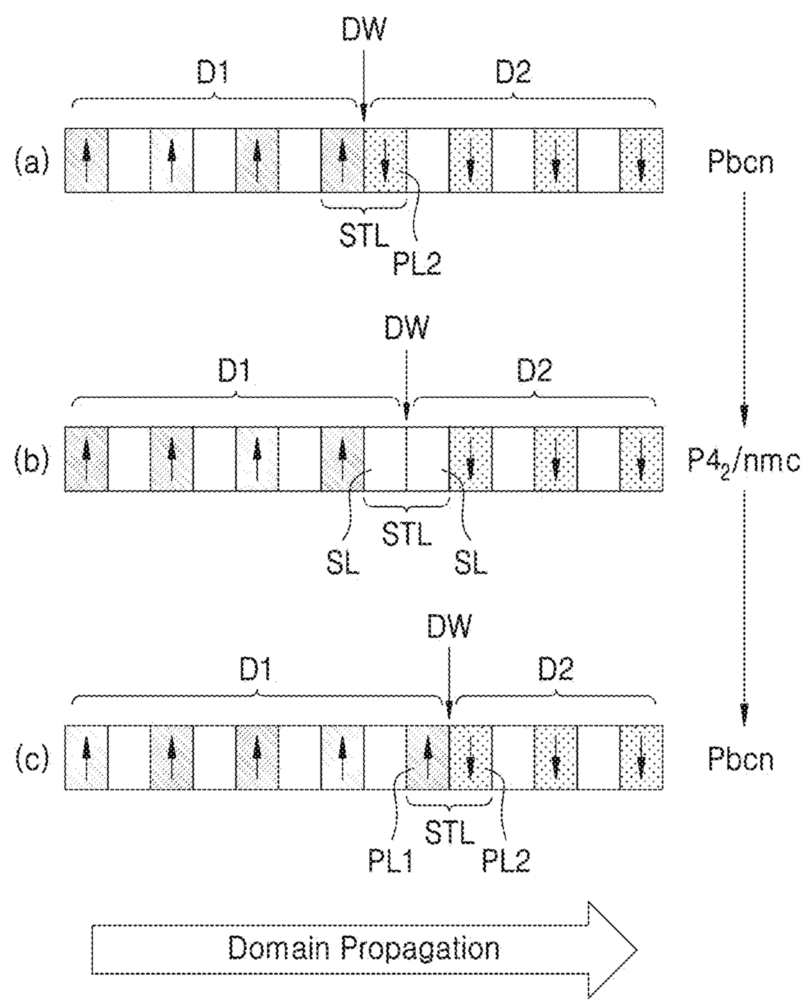
FIG. 2 is a schematic view showing a structure of a ferroelectric material and propagation of a domain wall, according to some example embodiments, in which view (a) is a schematic view showing a structure before propagation of the domain wall, view (b) is a schematic view showing a structure of the ferroelectric material during propagation of the domain wall, and view (c) is a schematic view showing a structure of the ferromagnetic material after propagation of the domain wall.

Referring to FIG. 2, for example, when an external electric field is applied to the ferroelectric material having a structure of (a) in FIG. 2, the symmetric structure of the second polarization layer (PL2) included in the structural layer (STL) changes, and thus the second polarization layer PL2 is converted into the spacer layer SL, and a ferroelectric state having a structure of (b) of FIG. 2 is reached. Subsequently, the symmetrical structure of the spacer layer SL included in the structure layer STL changes, and thus the spacer layer SL is additionally converted into the first polarization layer PL1, and thus the structure of a ferroelectric material is switched to a structure (c) of FIG. 2. Accordingly, while the symmetrical structure of the structural layer arranged at the domain wall changes, a polarization direction change occurs in the second polarization layer PL2 and/or the spacer layer SL adjacent to the second polarization layer PL2. Due to the polarization direction change in the structural layer at the domain wall, domain inversion occurs and the domain wall propagates. For example, domain propagation occurs (e.g. horizontally in FIG. 1). For example, while the structural layer goes through a process of forming a tetragonal crystalline phase, which belongs to or has atoms arranged according to $P4_2/nmc$ space group, from an orthorhombic crystalline phase, which belongs to or has atoms arranged according to a Pbcn space group, and then again forming the orthorhombic crystalline phase, which belongs to or has atoms arranged according to the Pbcn space group, the domain wall sequentially propagates. Due to the inclusion of the orthorhombic crystalline phase, which belongs to the Pbcn space group, in the structural layer STL arranged at the domain wall DW, the energy barrier when domain inversion occurs reduces, and thus, the domain propagation speed may increase. For example, the operation speed of an electronic device including the ferroelectric material may increase.

The ferroelectric material of some example embodiments may be a fluorite-based ferroelectric material including a fluorite-type compound. Alternatively or additionally, the fluorite-based ferroelectric material may have a fluorite-type structure, e.g., fluorite structure. As used herein, a fluorite-based structure or fluorite-type compound is a compound which may or may not include fluorine, and has an atomic structure such as $MX_2$. Here, M is a metal, and has atoms arranged according to a face-centered cubic structure. Accordingly, this is distinct from a perovskite-based ferroelectric material having a perovskite structure. The fluorite-based structure or fluorite-type compound may belong to $Pca2_1$, $P4_2/nmc$, $P2_1/c$, $Pmn2_1$, R3, or R3m space group.

Figure 3:
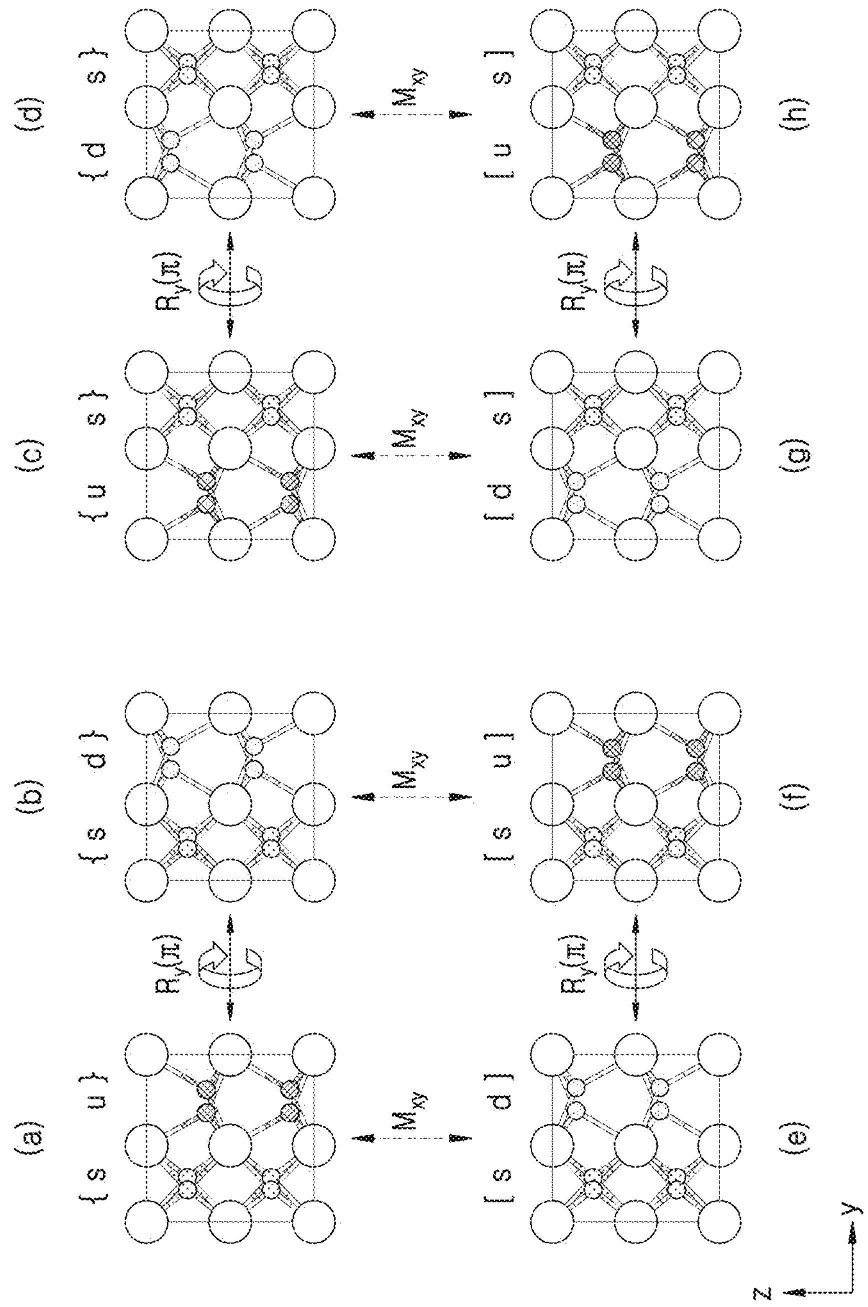
FIG. 3 shows schematic views (a) to (h) showing orthorhombic crystal structures of ferroelectric materials according to embodiments.

FIG. 3 shows detailed structures of a first polarization layer PL1, a second polarization layer PL2, and a spacer layer SL included in a ferroelectric material a fluorite structure, according to some example embodiments. In FIG. 3, { } indicates right-handed chirality, and [ ] indicates left-handed chirality. In FIG. 3, Mxy indicates a mirror image relationship. In FIG. 3, $Ry(\pi)$ indicates a relationship of rotation by 180 degrees/TT radians with respect to y-axis.

In FIG. 3, structure (a) is an image, in a (100) plane direction, of a ferroelectric unit cell which has a fluorite structure and includes a spacer layer SL and a first polarization layer PL1. The first polarization layer PL1 is a region which corresponds to the right half of the unit cell and is defined by two large metal ions and four small oxygen ions between them. More specifically, the first polarization layer PL1 is a region including four ⅛ metal ions arranged at right-side corners, four ¼ metal ions arranged on the front side, the rear side, the top side, and the bottom side, and one ½ metal ion arranged on the right side. Therefore, the first polarization layer PL1 includes four oxygen ions and two metal ions. In addition, in the first polarization layer PL1, the four oxygen ions and the two metal ions are arranged to have non-symmetry in a polar C-axis direction, and the first direction is one of two directions parallel to the polar C-axis direction. In the first polarization layer PL1, for example, the four oxygen ions may be arranged to deviate from a center plane between the two metal ions. Accordingly, the first polarization layer PL1 may have polarization, and may affect polarization of the ferroelectric material. The polarization layer PL may have a "u" form (up form) or a "d" form (down form) according to a polarization direction ((−)→(+)) dependent on the locations of the oxygen ions and metal ions of the polarization layer. For example, the first polarization layer PL1, which is polarized in a first direction, may have a "u" form. Accordingly, the first direction may be denoted by 1 (an up arrow), and may be denoted by u in (a) to (h) of FIG. 3. The first polarization layer PL1 may alternatively be referred to as a non-symmetric segment.

In FIG. 3, structure (b) is an image, in a (100) plane direction, of a ferroelectric unit cell which has a fluorite structure and includes a spacer layer SL and a second polarization layer PL2. The second polarization layer PL2 is a region which corresponds to the right half of the unit cell and is defined by two large metal ions and four small oxygen ions between them. More specifically, the first polarization layer PL2 is a region including four ⅛ metal ions arranged at left-side corners, four ¼ metal ions arranged on the front side, the rear side, the top side, and the bottom side, and one ½ metal ion arranged on the right side. Therefore, the second polarization layer PL2 includes four oxygen ions and two metal ions. In addition, in the second polarization layer PL2, the four oxygen ions and the two metal ions are arranged to have non-symmetry in a polar C-axis direction, and the second direction is a direction opposite to the first direction which is parallel to the polar C-axis direction. For example, in the second polarization layer PL2, the four oxygen ions may be arranged to deviate from the center plane between the two metal ions. Accordingly, the second polarization layer (PL2) may affect polarization of the ferroelectric material. The polarization layer PL may have a "u" form or a "d" form according to a polarization direction ((−)→(+)) dependent on the locations of the oxygen ions and metal ions of the polarization layer. For example, the second polarization layer PL2, which is polarized in a second direction, may have a "d" form. Accordingly, the second direction may be denoted by ↓, and may be denoted by d in (a) to (h) of FIG. 3. The second polarization layer PL1 may alternatively be referred to as a non-symmetric segment.

Referring to structures (a) and (b) of FIG. 3, the spacer layer (SL) is a region which corresponds to the left half of the unit cell and is defined by two large metal ions and four small oxygen ions between them. More specifically, the spacer layer SL is a region including four ⅛ metal ions arranged at left-side corners, four ¼ metal ions arranged on the front side, the rear side, the top side, and the bottom side, and one ½ metal ion arranged on the left side. Therefore, the spacer layer SL includes four oxygen ions and two metal ions. In addition, in the spacer layer SL, four oxygen ions and two metal ions are arranged to have symmetry in the polar C-axis direction. For example, in the spacer layer SL, the four oxygen ions may be arranged on the center plane between the two metal ions. Accordingly, the spacer layer SL may not affect polarization of the ferroelectric material. The spacer layer is indicated by s in (a) to (h) of FIG. 3. The spacer layer SL may also be referred to differently as a symmetric segment.

In FIG. 3, structure (b) corresponds to a structure that structure (a) rotated by 180 degrees with respect to y-axis. Accordingly, structure (b) of FIG. 3 has the same chirality as structure (a) of FIG. 3. In FIG. 3, structure (e) corresponds to a mirror image structure of structure (a) of FIG. 3. Accordingly, structure (e) of FIG. 3 has different chirality from structure (a) of FIG. 3. In FIG. 3, structure (f) corresponds to a mirror image structure of structure (b) of FIG. 3. Accordingly, structure (f) of FIG. 3 has different chirality from structure (b) of FIG. 3. In FIG. 3, structure (c) corresponds to a structure in which a first polarization layer PL1 and a spacer layer SL are arranged at positions opposite to those of structure (a) of FIG. 1. In FIG. 3, structure (d) corresponds to a structure that structure (c) rotated by 180 degrees with respect to y-axis. Accordingly, structure (d) of FIG. 3 has the same chirality as structure (c) of FIG. 3. In FIG. 3, structure (g) corresponds to a mirror image structure of structure (c) of FIG. 3. Accordingly, structure (g) of FIG. 3 has different chirality from structure (c) of FIG. 3. In FIG. 3, structure (h) corresponds to a mirror image structure of structure (d) of FIG. 3. Accordingly, structure (h) of FIG. 3 has different chirality from structure (d) of FIG. 3.

Referring to FIGS. 1 to 4, the first domain D1 may include a plurality of first polarization layers PL1 and a plurality of spacer layers SL arranged between the plurality of first polarization layers PL1, and the second domain D2 may include a plurality of second polarization layers PL2 and a plurality of spacer layers SL arranged between the plurality of second polarization layers PL2. For example, the first domain D1 may have a structure in which a plurality of first polarization layers PL1 and a plurality of spacer layers SL are alternately arranged along one direction. The direction in which the plurality of first polarization layers PL1 and the plurality of spacer layers SL are alternately arranged may be, for example, a direction oppose to/orthogonal to the domain wall DW. For example, the second domain D2 may have a structure in which a plurality of second polarization layers PL2 and a plurality of spacer layers SL are alternately arranged along one direction. The direction in which the plurality of second polarization layers PL2 and the plurality of spacer layers SL are alternately arranged may be, for example, a direction oppose to/orthogonal to the domain wall DW. The plurality of first polarization layers PL1 included in the first domain D1 may be polarized in the same first direction. For example, the plurality of first polarization layers may be denoted by ↑ in FIGS. 1, 2, and 4, and by u in (a) to (h) of FIG. 3. The plurality of second polarization layers PL2 included in the second domain D2 may polarize in the same second direction. For example, the plurality of second polarization layers PL2 may be denoted by ↓ in FIGS. 1, 2, and 4, and by d in (a) to (h) of FIG. 3.

Figure 4:
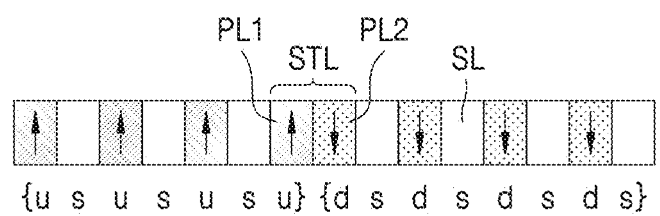
FIG. 4 is a schematic view showing chirality of the structure of a ferroelectric material according to some example embodiments.

Referring to FIG. 4, first polarization layers PL1 and second polarization layers PL2, which are included in the structural layer STL, may have, for example, the same chirality. For example, the first polarization layers PL1 are polarized in the first direction, and thus, are denoted by u, and the second polarization layers PL2 are polarized in the second direction, and thus, are denoted by d. However, the first polarization layers PL1 and the second polarization layers PL2 have the same right-handed chirality, and thus, may be denoted by { }. For example, the first polarization layers PL1 and the second polarization layers PL2 are denoted by {u} and {d}, respectively. Thus, mirror images of the steric atomic arrangements of the first polarization layers PL1 and the second polarization layers PL2 may be superimposable. Since the first polarization layers PL1 and the second polarization layers PL2 have the same chirality, the magnitude of the energy barrier when domain inversion and/or polarization direction switching occurs may be reduced.

Figure 5:
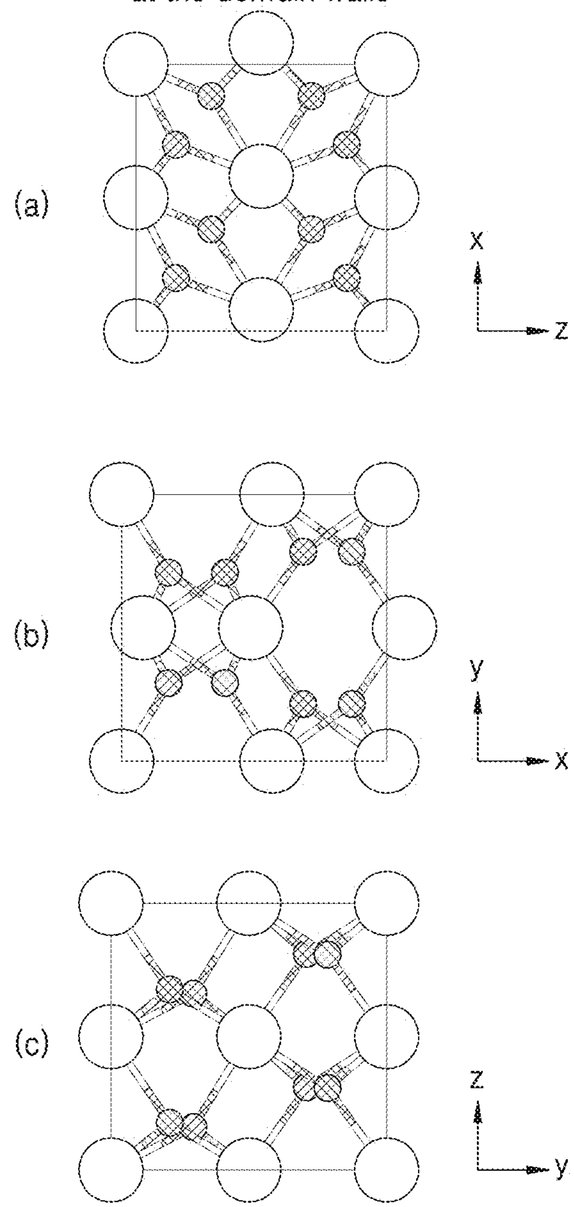
FIG. 5 shows schematic views (a) to (c) of orthorhombic crystal structures, which belong to/have atoms arranged in a Pbcn space group and are disposed at domain walls of a ferroelectric material according to some example embodiments.
Figure 6:
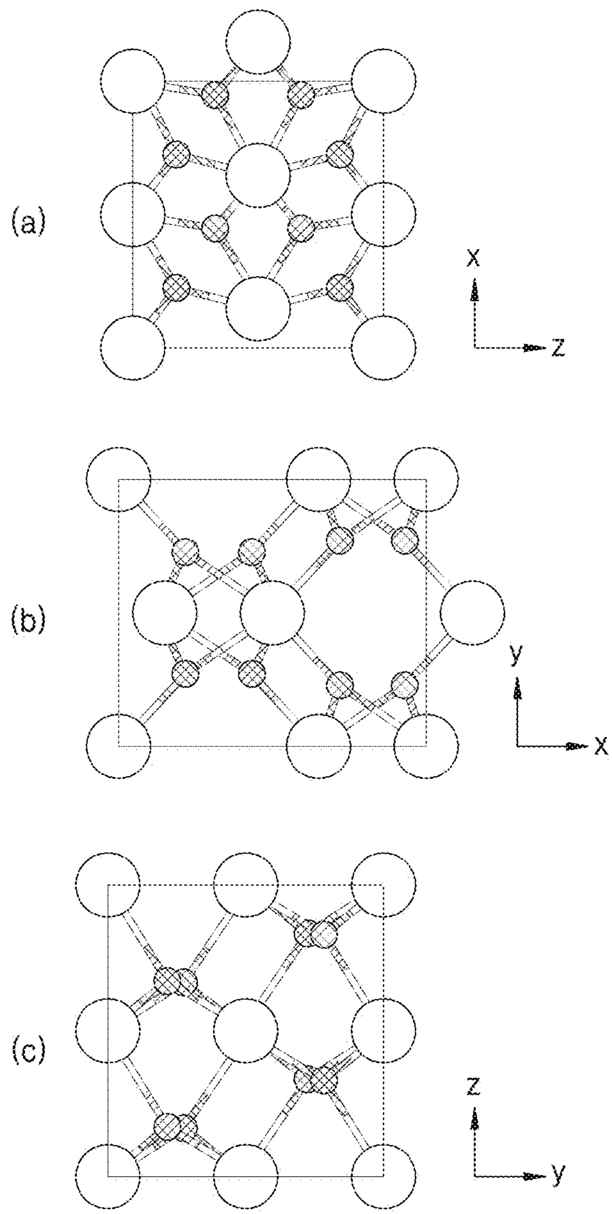
FIG. 6 shows schematic views (a) to (c) of orthorhombic crystal structures, which belong to/have atoms arranged in a Pbcn space group and are disposed in a bulk state domain of a ferroelectric material according to some example embodiments.

FIG. 5 shows schematic views (a) to (c) of fluorite crystal structures, which are included in a structural layer locally arranged at domain walls and belong to/having atoms arranged according to a Pbcn space group, and FIG. 6 shows schematic views (a) to (c) of fluorite crystal structures in a bulk state domain, which belong to/has atoms arranged according to a Pbcn space group. In FIGS. 5 and 6, (a) shows fluorite crystal structures along a (010) direction. In FIGS. 5 and 6, (b) shows fluorite crystal structures along a (001) direction. In FIGS. 5 and 6, (c) shows fluorite crystal structures along a (100) direction.

As shown in (a) to (c) of FIGS. 5 and 6, the crystal structure of a crystalline phase, which belong to/has atoms arranged according to a Pbcn space group, in the structural layer locally disposed at the domain walls differs from the crystal structure of a crystal phase which belongs to a Pbcn space group disposed in a bulk state domain. Accordingly, in the ferroelectric material including the structural layer, which belongs to a Pbcn space group, at the domain walls, the magnitude of an energy barrier when domain conversion or polarization direction switching occurs may reduce.

Figure 7A:
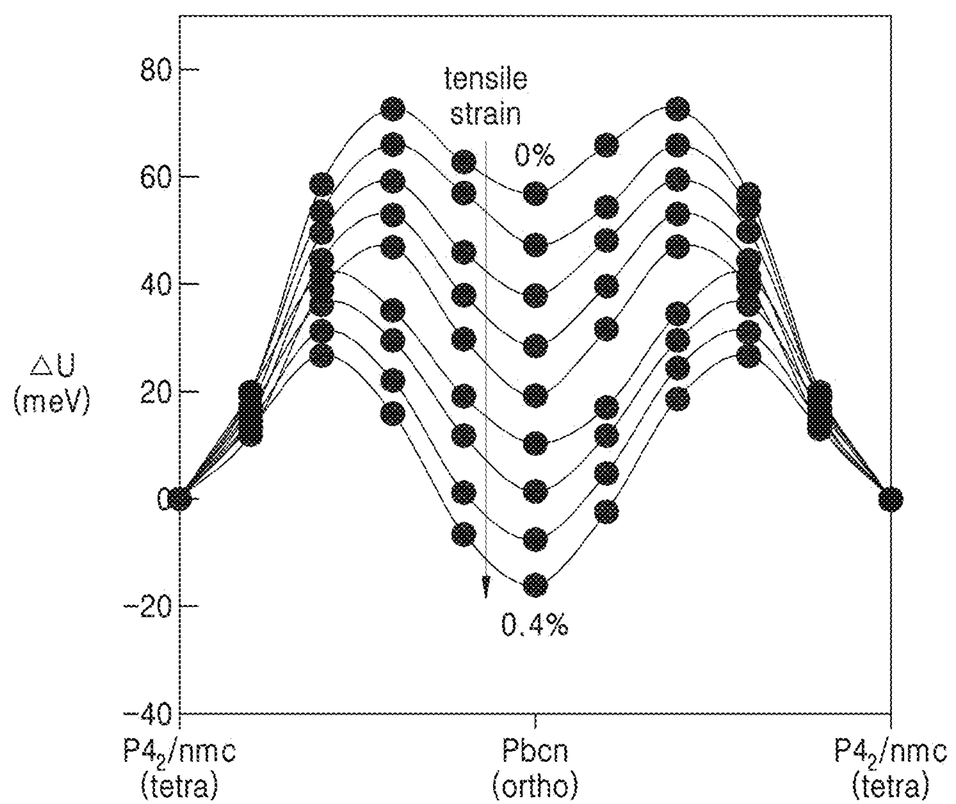
FIG. 7A is a graph showing results of calculation of changes in energy barrier in a ferroelectric material including a domain which belongs a Pbcn space group, and changes in energy barrier according to strain magnitude in a domain inversion from the domain which belongs to the Pbcn space group to a domain which belongs to a P42/nmc space group.
Figure 7B:
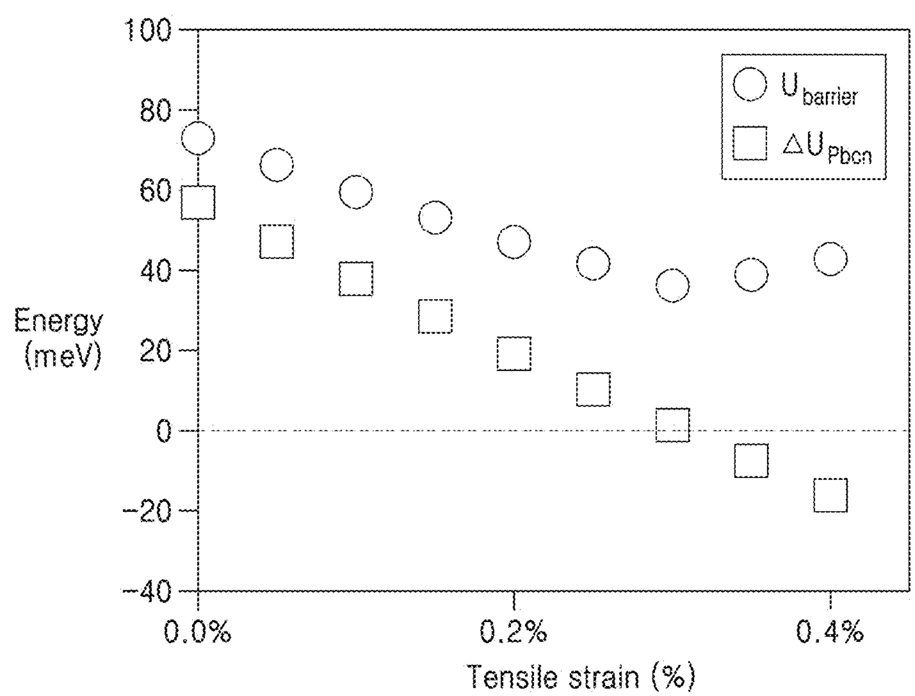
FIG. 7B is a graph showing an energy barrier with respect to strain magnitude when domain inversion (e.g., switching energy) occurs, and relative stability of the domain which belongs to the Pbcn space group to the domain which belongs to the P42/nmc space group.

FIG. 7A shows results of calculation of changes in energy barrier in a ferroelectric material including a domain which belongs a Pbcn space group, and changes in energy barrier according to strain magnitude, when domain inversion occurs from the domain which belongs to the Pbcn space group to a domain which belongs to a P42/nmc space group; FIG. 7B shows energy barrier with respect to strain magnitude when domain inversion (i.e., switching energy) occurs, and relative stability of the domain which belongs to the Pbcn space group to the domain which belongs to the $P4_2$/nmc space group.

As shown in FIGS. 7A and 7B, when 0% strain was applied to the ferroelectric material, the energy barrier when domain inversion occurred from the domain which belongs to a Pbcn space group to the domain which belongs to a $P4_2$/nmc space group was 73 meV. Meanwhile, when 0.3% strain was applied to the ferroelectric material, the energy barrier when domain inversion occurred from the domain which belongs to a Pbcn space group to the domain which belongs to a $P4_2$/nmc space group was 36 meV. Accordingly, as the strain applied to the ferroelectric material increased, the energy barrier when domain inversion occurred from the domain belonging to the Pbcn space group to the domain belonging to the $P4_2$/nmc space group was reduced by 51%. Alternatively or additionally, as shown in FIG. 7B, relative stability of the crystalline phase which belongs to the Pbcn space group with respect to the crystalline phase which belongs to the $P4_2$/nmc space group significantly increased. For example, it can be shown that in the ferroelectric material locally including the structural layer, which belongs to the Pbcn space group, at the domain walls between the domains which belong to the $P4_2$/nmc space group, the energy barrier when domain inversion occurred significantly reduced, compared to existing fluorite-based ferroelectric materials of the related art, and the energy barrier when domain inversion occurred further reduced as a strain was applied to the ferroelectric material.

Referring to FIGS. 7A to 7B, a strain applied to the structural layer may be, for example, about −1% to about 1%, or about −0.5% to about 0.5%. The strain applied to the structural layer STL may be, for example, about −1% to about −0.1%, or about −0.5% to about −0.1%. The strain applied to the structural layer STL may be, for example, about 0.1% to about 1%, or about 0.1% to about 0.5%. When the strain applied to the structural layer is within these ranges, the magnitude of the energy barrier when domain inversion or polarization direction switching occurs may be reduced. The strain applied to the structural layer STL may be, for example, tensile strain. The strain applied to the structural layer STL may be implemented using various methods, for example, one or more of heat treatment such as annealing, doping with dopants, and/or the like. For example, by doping a ferroelectric material with dopants having an atomic size different from atoms constituting the ferroelectric material, a strain may be applied to the structural layer. Alternatively or additionally, by arranging and annealing a metal electrode layer on a dielectric layer including the ferroelectric compound and annealing a metal electrode layer, a strain may be applied to the structural layer.

Referring to FIGS. 1, 2, and 4, the first domain D1 and the second domain D2 included in the ferroelectric material may each independently include at least one crystalline phase selected from an orthorhombic crystalline phase, a tetragonal crystalline phase, and a cubic crystalline phase. For example, the first domain D1 and the second domain D2 may each independently include an orthorhombic crystalline phase. For example, the first domain D1 and the second domain D2 may each independently include an orthorhombic crystalline phase and a tetragonal crystalline phase. For example, the first domain D1 and the second domain D2 may each independently include an orthorhombic crystalline phase and a cubic crystalline phase. For example, the first domain D1 and the second domain D2 may each independently include an orthorhombic crystalline phase, a tetragonal crystalline phase, and a cubic crystalline phase. For example, the ferroelectric material may predominantly include an orthorhombic crystalline phase. The expression "predominantly including" or "including in plurality" means or refers to a particular crystalline phase is included at the highest content among all of the crystalline phases or has a two-digit content as a percentage.

The orthorhombic crystalline phase may have, for example, a structure which belongs to/has atoms arranged according to a Pca21 space group. The tetragonal crystalline phase may have, for example, a structure which belongs to/has atoms arranged according to a $P4_2$/nmc space group. The cubic crystalline phase may have, for example, a structure which belongs to a Fm-3m space group. For example, the ferroelectric material may include a tetragonal crystalline phase, which is a structural layer which belongs to a Pbcn space group, at the domain wall DW among a plurality of domains including a tetragonal crystalline phase which belongs to a $P4_2$/nmc space group.

A crystal structure, crystalline phase, and atomic arrangement of the ferroelectric material may be identified using, for example, one or more of scanning transmission electron microscopy (STEP), high-angle annular dark-field-scanning transmission electron microscopy (HAADF-STEM), transmission electron microscopy (TEM), or grazing incidence X-ray diffraction (GIXRD). However, example embodiments are not limited thereto, and any one or more method available in the technical field concerned is applicable.

An amount of the structural layer, which belongs to/is arranged in the Pbcn space group, included in the ferroelectric material, may be greater than 0 vol % and less than or equal to 40 vol %, greater than 0 vol % and less than or equal to 30 vol %, greater than 0 vol % and less than or equal to 20 vol %, or greater than 0 vol % and less than or equal to 10 vol %, with respect to a total volume of the ferroelectric material. Vol % indicates a volume percentage.

The amount of the structural layer which belongs to/is arranged in the Pbcn space group may be, for example, greater than 0 mol % and less than or equal to 40 mol %, greater than 0 mol % and less than or equal to 30 mol %, greater than 0 mol % and less than or equal to 20 mol %, or greater than 0 mol % and less than or equal to 10 mol %, with respect to the total number of moles of the ferroelectric material. Mol % indicates a mole percentage.

The amount of the structural layer which belongs to/is arranged in the Pbcn space group may be, for example, greater than 0 at % and less than or equal to 40 at %, greater than 0 at % and less than or equal to 30 at %, greater than 0 at % and less than or equal to 20 at %, or greater than 0 at % and less than or equal to 10 at %, with respect to the total number of atoms in the ferroelectric material. At % indicates an atomic percent.

The amount of the structural layer which belongs to/is arranged in the Pbcn space group may be, for example, greater than 0 wt % and less than or equal to 40 wt %, greater than 0 wt % and less than or equal to 30 wt %, greater than 0 wt % and less than or equal to 20 wt %, or greater than 0 wt % and less than or equal to 10 wt %, with respect to a total mass of the ferroelectric material. Herein, wt % indicates a mass percent.

When the amount of the ferroelectric material is within these ranges, the magnitude of the energy barrier when domain inversion or polarization direction switching occurs in the ferroelectric material may further effectively reduce.

For example, the ferroelectric material may include a binary metal oxide represented by Formula 1.

$MO_2$ <Formula 1>

In Formula 1, M is an element which belongs to Group 4 of the periodic table of the elements.

In the binary metal oxide, M may be, for example, Hf, Zr, or a combination of Hf and Zr. The binary metal oxide may be, for example, $HfO_2$, $ZrO_2$, or $Hf_{1-a}Zr_aO_2$ (wherein $0 \leq a \leq 0.15$). When the ferroelectric material includes such a binary metal oxide, the magnitude of the energy barrier when domain inversion or polarization direction switching occurs may further effectively reduce.

For example, the binary metal oxide may further include a dopant.

When the binary metal oxide further includes a dopant, a structural strain may be added to the binary metal oxide. Accordingly, as shown in FIGS. 7A and 7B, in the ferroelectric material including a binary metal oxide, the magnitude of the energy barrier when domain inversion or polarization direction switching occurs may further reduce.

The dopant included in the binary metal oxide may be, for example, at least one selected from C, Si, Ge, Sn, Pb, Al, Y, La, Gd, Mg, Ca, Sr Ba, and Ti. An amount of the dopant included in the binary metal oxide may be, with respect to the entire remainder of atoms other than oxygen, greater than 0 at % and less than or equal to 20 at %, greater than 0 at % and less than or equal to 18 at %, greater than 0 at % and less than or equal to 15 at %, greater than 0 at % and less than or equal to 12 at %, greater than 0 at % and less than or equal to 10 at %, greater than 0 at % and less than or equal to 8 at %, greater than 0 at % and less than or equal to 7 at %, greater than 0 at % and less than or equal to 5 at %, greater than 0 at % and less than or equal to 4 at %, greater than 0 at % and less than or equal to 3 at %, greater than 0 at % and less than or equal to 2 at %, greater than 0 at % and less than or equal to 1 at %, greater than 0 at % and less than or equal to 0.8 at %, greater than 0 at % and less than or equal to 0.5 at %, greater than 0 at % and less than or equal to 0.2 at %, or greater than 0 at % and less than or equal to 0.1 at %.

For example, the ferroelectric material may include a binary metal oxide represented by Formula 2 or 3.

$Hf_{1-x}D_xO_2$ <Formula 2>

$Zr_{1-y}D_yO_2$ <Formula 3>

In Formulae 2 and 3, D may be at least one selected from among C, Si, Ge, Sn, Pb, Al, Y, La, Gd, Mg, Ca, Sr Ba, and Ti, and $0 \leq x \leq 0.15$, and $0 \leq y \leq 0.15$.

In Formula 2, x may satisfy that, for example, $0 \leq x \$ 0.12$, $0 \leq x \leq 0.1$, $0 \leq x \leq 0.08$, $0 \leq x \leq 0.07$, $0 \leq x \leq 0.05$, $0 \leq x \leq 0.04$, $0 \leq x \leq 0.03$, $0 \leq x \leq 0.02$ $0 \leq x \leq 0.01$, $0 \leq x \leq 0.008$, $0 \leq x \leq 0.005$, $0 \leq x \leq 0.002$, or $0 \leq x \leq 0.001$. In Formula 3, y may satisfy that, for example, $0 \leq y \leq 0.12$, $0 \leq y \leq 0.1$, $0 \leq y \leq 0.08$, $0 \leq y \leq 0.07$, $0 \leq y \leq 0.05$, $0 \leq y \leq 0.04$, $0 \leq y \leq 0.03$, $0 \leq y \leq 0.02$ $0 \leq y \leq 0.01$, $0 \leq y \leq 0.008$, $0 \leq y \leq 0.005$, $0 \leq y \leq 0.002$, or $0 \leq y \leq 0.001$.

According to one or more example embodiments, provided is an electronic device including a thin-film dielectric layer, wherein the thin-film dielectric layer includes the ferroelectric material according to the one or more various example embodiments described above.

As the electronic device includes the ferroelectric material described above, the performance of the electronic device, such as the operation speed, may be improved.

A thickness of the thin-film dielectric layer may be, for example, about 0.1 nm to about 50 nm, about 0.1 nm to about 40 nm, about 0.1 nm to about 30 nm, about 0.1 nm to about 20 nm, about 0.1 nm to about 10 nm, about 0.1 nm to about 7 nm, about 0.1 nm to about 5 nm, about 0.1 nm to about 4 nm, about 0.1 nm to about 3 nm, about 0.1 nm to about 2 nm, about 0.1 nm to about 1.5 nm, or about 0.1 nm to about 1 nm. When the thin-film dielectric layer has a thickness with these ranges, ferroelectricity may be more effectively provided.

A current versus time profile when polarization switching occurs due to application of a voltage to the thin-film dielectric layer may have a peak in a time range of greater than 0 seconds and less than or equal to $5 \times 10^{-7}$ seconds, greater than 0 and less than or equal to $1 \times 10^{-7}$ seconds, greater than 0 and less than or equal to $5 \times 10^{-8}$ seconds, greater than 0 and less than or equal to $1 \times 10^{-8}$ seconds, greater than 0 and less than or equal to $5 \times 10^{-9}$ seconds, or greater than 0 and less than or equal to $1 \times 10^{-9}$ seconds. As the current profile according to time when polarization switching occurs by applying a voltage to the thin-film dielectric layer has a peak within these short time ranges, an electronic device including the thin-film dielectric layer may have a faster driving speed.

The thin-film dielectric layer may be formed by forming an amorphous layer including a ferroelectric material having a composition of Formulae 1 to 3 and annealing the amorphous layer to induce a crystalline phase.

The amorphous layer may be formed using a common method. The amorphous layer may be formed using, for example, one or more of an atomic layer deposition (ALD), chemical vapor deposition (CVD), physical vapor deposition (PVD), or the like. An ALD method enables forming a uniform layer at an atomic level and may be performed at a relatively low temperature.

When the amorphous layer is formed by the ALD method, common precursors may be used for a hafnium source, a zirconium source, and an oxygen source.

For example, the hafnium source may be selected from $Hf(OtBu)_4$, tetrakis(ethylmethylamino) hafnium (TEMAH), tetrakis(dimethylamino) hafnium (TDMAH), tetrakis(diethylamino) hafnium (TDEAH), or a combination of at least two thereof, but is not necessarily limited thereto. Any material available as a hafnium source may be used.

For example, the zirconium source may be selected from $Zr(OtBu)_4$, tetrakis(ethylmethylamino) zirconium (TEMAZ), tetrakis(dimethylamino) zirconium (TDMAZ), tetrakis(diethylamino) zirconium (TDEAZ), or a combination of at least two thereof, but is not necessarily limited thereto. Any material available as a zirconium source may be used.

For example, the oxygen source may be selected from $O_3$, $H_2O$, $O_2$, $N_2O$, $O_2$ plasma, or a combination of at least two thereof, but is not necessarily limited thereto. Any material available as an oxygen source may be used.

The amorphous layer may additionally include a dopant. As the amorphous layer additionally includes a dopant, a strain may be applied to a crystalline phase induced from the amorphous layer. As a result, the energy barrier when domain inversion occurs in the thin-film dielectric layer may reduce. For example, a dopant source may be a compound including one or more elements selected from C, Si, Ge, Sn, Pb, Al, Y, La, Gd, Mg, Ca, Sr Ba, and Ti, and any appropriate material available may be used. The amount of the dopant may be adjusted according to the physical properties of the thin-film dielectric layer.

A carbon source may be a hydrocarbon such as one or more of methane, ethane, and/or the like, but is not necessarily limited thereto, and any material available as a carbon source may be used.

A silicon source may be a silane-based compound such as one or more of $SiH_4$, $Si_2H_6$, and the like, but is not necessarily limited thereto, and any material available as a silicon source may be used.

A germanium source may be a germanium-based compound such as one or more of tetrakis(dimethylamino) germanium (TDMAGe, $C_8H_{24}N_4Ge$), bis(N,N'-dimethylethylenediamine) germanium (BDMEDAGe, $C_8H_{20}N_4Ge$), or the like, but is not necessarily limited thereto, and any material available as a germanium source may be used.

A tin source may be a tin-based compound such as one or more of $SnCl_2$, $Sn(SPh)_4$, tin(IV) bis(hexamethylsilylamide), or the like, but is not necessarily limited thereto, and any material available as a tin source may be used.

A lead source may be a lead-based compound such as one or more of $Pb(Ac)_2$ (Ac=acetate), $PbCl_2$, or the like, but is not necessarily limited thereto, and any material available as a lead source may be used.

An aluminum source may be an aluminum-based compound such as one or more of trimethoxyaluminum (TMA), dimethylaluminum chloride (DMACl), or the like, but is not necessarily limited thereto, and any material available as an aluminum source be used.

An yttrium source may be an yttrium-based compound such as one or more of $Y(thd)_3$ (thd=2,2,6,6-tetramethyl-3,5-heptanedionato), $Y(CH_3Cp)_3$ (Cp=cyclopentadienyl), or the like, but is not necessarily limited thereto, and any material available as a yttrium source may be used.

A lanthanum source may be a lanthanum-based compound such as one or more of $La(thd)_3$ (thd=2,2,6,6-tetramethyl-3,5-heptane-dione), $La(Cp)_3$ (Cp=cyclopentadienyl), or the like, but is not necessarily limited thereto, and any material available as a lanthanum source be used.

A gadolinium source may be a gadolinium-based compound such as one or more of $Gd(thd)_3$, $Gd(DPDMG)_3$ (DPDMG=N,N-diisopropyl-2-dimethylamido-guanidinato), or the like, but is not necessarily limited thereto, and any material available as a gadolinium source may be used.

A magnesium source may be a magnesium-based compound such as one or more of $Mg(thd)_2$, $MgCl_2$, or $Mg(NO_3)_2$, but is not necessarily limited thereto, but is not necessarily limited thereto, and any material available as a magnesium source may be used.

A calcium source may be a calcium-based compound such as one or more of ($\alpha$-methylstyrene)Cu(I)(hfac) (hfac=hexafluoroacetylacetonate), (hfac)Cu(I)DMB (DMB=3,3-dimethyl-1-butene), or the like, but is not necessarily limited thereto, and any material available as a calcium source may be used.

A strontium source may be a strontium-based compound such as one or more of $Sr(tmhd)_2$ (tmhd=2,2,6,6-tetramethyl-3.5-heptanedione), $Sr(iPrCp)_2$ (iPr=isopropyl, Cp=cyclopentadienyl), or the like, but is not necessarily limited thereto, and any material available as a strontium source may be used.

A barium source may be a barium-based compound such as $Ba(CpiPr_3)_2$ (Bis (triisopropylcyclopentadienyl)barium), $Ba(TMHD)_2$ (Bis(2,2,6,6-tetramethyl-3,5-heptanedionato) barium hydrate), but is not necessarily limited thereto, and any material available as a barium source may be used.

A titanium source may be a titanium-based compound such as $TiCl_4$, TTIP($C_8H_{24}N_4Ti$), trimethoxy (pentamethylcyclopentadienyl) titanium ($(CpMe_5)Ti(OMe)_3$), or the like, but is not necessarily limited thereto, and any material available as a titanium source may be used.

The annealing may be controlled in temperature, time, atmosphere, and the like so that the amorphous layer is crystallized to have a crystalline structure, for example, an orthorhombic crystalline structure. A thermal budget of the annealing may be determined in consideration of the composition, thickness, and the like of the amorphous layer. The annealing may be performed at a temperature of, for example, about 400° C. to about 1100° C., but is not necessarily limited to this temperature range, and may be controlled according to physical properties required. The annealing may be performed for, for example, about 1 nanosecond to about 1 hour, about 1 microsecond to about 30 minutes, about 0.001 seconds to about 10 minutes, about 0.01 second to about 10 minutes, about 0.05 seconds to about 5 minutes, about 0.1 second to about 3 minutes, about 0.5 seconds to about 2 minutes, about 1 second to about 1 minutes, about 3 seconds to about 1 minute, or about 5 seconds to about 30 seconds, but is not necessarily limited to these ranges, and may be controlled according to physical properties required. The annealing may be performed at least one time. The annealing may be performed, for example, multiple times. The annealing may include, for example, first annealing and second annealing. The first annealing and the second annealing may be the same, or may be different in terms of at least one of the annealing temperature and the annealing time. For example, the first annealing may be performed at a lower temperature or for a shorter period of time than the second annealing. The atmosphere in which the annealing is performed is not particularly limited. For example, the first annealing and the second annealing may each be performed under an atmosphere of $H_2O$, $O_2$, $O_3$, $N_2$, $H_2$, and/or $NH_3$.

In some example embodiments, the thin-film dielectric layer may be formed, for example, by forming on a substrate a crystalline layer including a ferroelectric material having a composition of Formulae 1 to 3. For example, the crystalline layer may be formed using a method such as epitaxy, liquid phase epitaxy, vapor phase epitaxy, chemical vapor deposition (CVD), sputtering, pulsed laser deposition (PLD), or the like.

For example, the electronic device may further include a thin-film electrode layer, and the thin-film electrode layer may be arranged on one surface or both surfaces of the thin-film dielectric layer.

For example, the electronic device may include: a thin-film dielectric layer including the ferroelectric material described above; and a thin-film electrode layer arranged on one surface or both surfaces of the thin-film dielectric layer.

A thickness of the thin-film electrode layer may be, for example, about 10 nm to about 1000 nm, about 10 nm to about 500 nm, or about 10 nm to about 100 nm.

The thin-film electrode layer included in the electronic device may be, for example, amorphous or crystalline. The crystalline thin-film electrode layer may have various crystalline structures. The thin film electrode layer may have, for example, a tetragonal structure, a cubic structure, a hexagonal structure, a monoclinic structure, a triclinic structure, or an orthorhombic structure. As the thin-film electrode layer has such a crystalline structure, interfacial stability with the thin-film dielectric layer may be improved.

At least one thin-film electrode layer may include at least one selected from a metal, an oxide of the metal, a doped oxide of the metal, a nitride of the metal, and a carbide of the metal.

The metal included in at least one thin-film electrode layer may include, for example, at least one selected from Ti, W, Ta, Co, Mo, Ni, V, Hf, Al, Cu, Pt, Pd, Ir, Au, and Ru. The metal included in at least one thin-film electrode layer is not limited thereto, and any metal used for an electrode layer may be used.

The metal oxide (oxide of the metal) included in at least one thin-film electrode layer may include, for example, at least one selected from $RuO_2$, $IrO_2$, $PtO_2$, $SnO_2$, $MnO_2$, $Sb_2O_3$, and $In_2O_3$. The metal oxide included in at least one thin-film electrode layer is not limited thereto, and any metal oxide used in an electrode layer may be used.

The doped metal oxide (doped oxide of the metal) included in at least one thin-film electrode layer may include, for example, at least one selected from Ta-doped $SnO_2$, Ti-doped $In_2O_3$, Ni-doped $SnO_2$, Sb-doped $SnO_2$, and Al-doped ZnO. The doped metal oxide included in at least one thin-film electrode layer is not limited thereto, and any doped metal oxide used in an electrode layer may be used. The type of a dopant of the doped metal oxide is not specifically limited, and any dopant, for example any dopant that improves conductivity of metal oxide is possible. The dopant may be, for example, a metal.

The metal nitride (nitride of the metal) included in at least one thin-film electrode layer may include, for example, at least one selected from TIN, WN, TaN, TiAlN, TaSiN, TiSiN, WSiN, TICN, TAlCN, RuCN, and RuTiN. The metal nitride included in at least one thin-film electrode layer is not limited thereto, and any metal nitride used for an electrode layer may be used. The metal nitride may include a carbon-containing nitride of a metal.

As the electronic device additionally includes the thin-film electrode layer, the electronic device may be used for various purposes. The electronic device may be or may include, for example, a capacitor, a transistor, a memory unit, and/or the like. The electronic device may be, for example, a semiconductor device such as a memory device, a non-memory device such as a logic device, or the like. The semiconductor device may be, for example, a capacitor, a field-effect transistor (FET), or a combined structure of a capacitor and a FET, but is not limited thereto.

For example, the electronic device may further include: a semiconductor substrate including a source and a drain; and a gate electrode arranged on the semiconductor substrate, wherein the thin-film dielectric layer may be arranged between the semiconductor substrate and the gate electrode.

For example, the electronic device may include: a semiconductor substrate including a source and a drain; a gate electrode arranged on the semiconductor substrate; and a thin-film dielectric layer arranged between the semiconductor substrate and the gate electrode.

Figure 8:
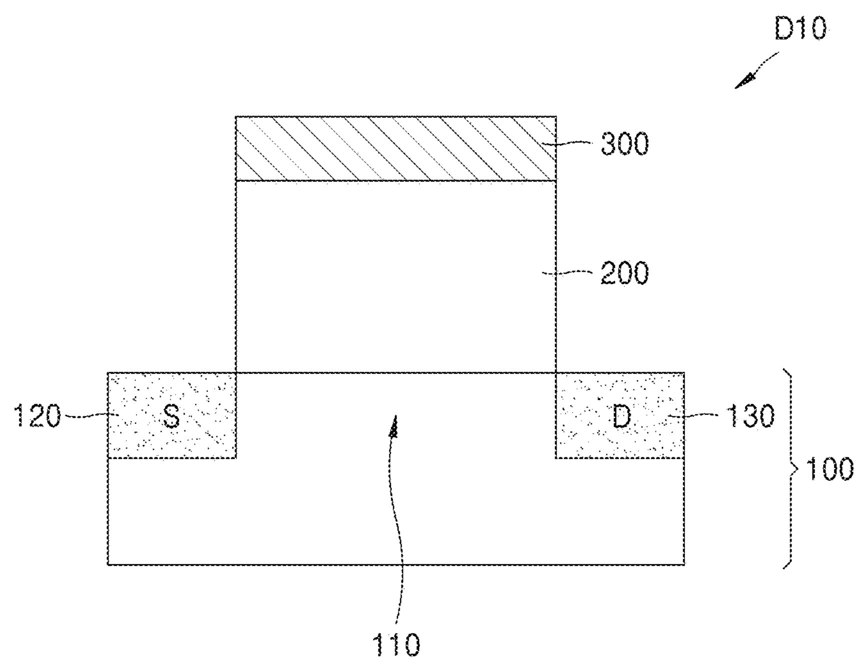
FIGS. 8 and 9 are schematic views showing field-effect transistors (FETs) according to some example embodiments.
Figure 9:
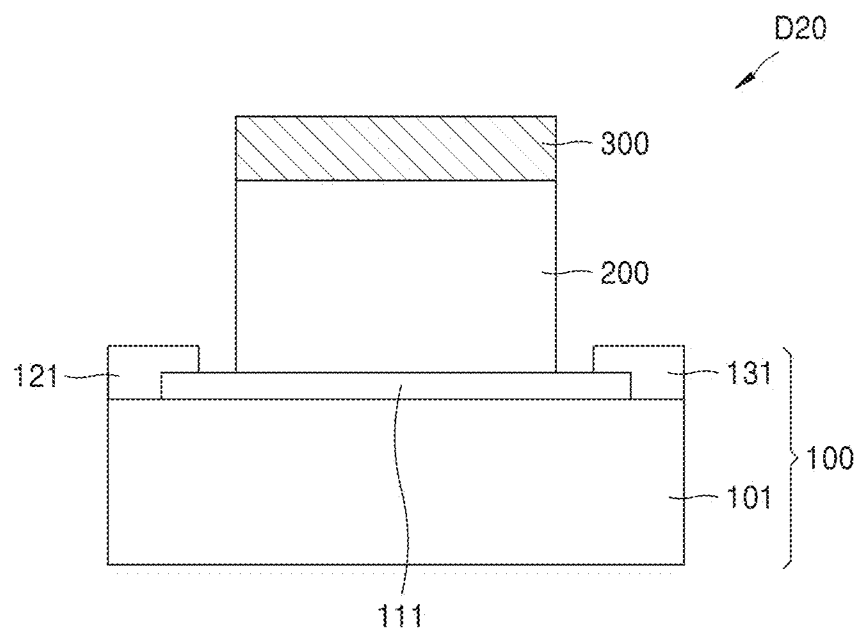

FIGS. 8 and 9 are schematic views showing field-effect transistors (FETs) according to embodiments.

Referring to FIGS. 8 and 9, each FET D10 (D20) includes: a substrate including a source 120 (121) and a drain 130 (131); a gate electrode 300 arranged on the substrate 100; and a first thin-film dielectric layer 200 which is arranged between the substrate 100 and the gate electrode 300 and includes the ferroelectric material according to the one or more embodiments described above. The FETs D10 and D20 may be or may include or correspond to or be included in logic switching devices. Logic switching devices, having a concept in contrast to memory devices (memory transistors), may have non-memory properties, and may be non-memory ON/OFF switching devices.

The substrate 100 may include a semiconductor material. For example, the substrate 100 may include Si, Ge, SiGe, a Group III-V semiconductor, or the like, and may be modified and used in various forms such as a silicon on insulator (SOI).

The substrate 100 may include the source 120 (121) and the drain 130 (131), and may include a channel 110 (111) electrically connected to the source 120 (121) and the drain 130 (131). The source 120 (121) may be electrically connected to or contact one end of the channel 110 (111), and the drain 130 (131) may be electrically connected or may contact the other end of the channel 110 (111).

Referring to FIG. 8, the channel 110 may be defined as a substrate region between the source 120 and the drain 130 in the substrate 100. The source 120 and the drain 130 may be formed by implanting impurities into different regions of the substrate 100. In this case, the source 120, the channel 110, and the drain 130 may include a substrate material as a base material.

The electronic device may further include an insulating layer arranged between the thin-film dielectric layer and the semiconductor substrate.

Referring to FIG. 9, the channel 111 may be implemented as a thin-film material layer separate from a substrate region 101. A material constituting the channel 111 may be selected according to required physical properties of the electronic device. For example, the channel 111 may include a material selected from: semiconductor materials such as Si, Ge, SiGe, Group III-V, or the like; an oxide semiconductor; a nitride semiconductor; an oxynitride semiconductor; a two-dimensional (2D) material; a quantum dot (QD), an organic semiconductor; and combinations of at least two thereof. For example, the oxide semiconductor may include, for example, InGaZnO or the like. The 2D material may include transition metal dichalcogenide (TMD) or graphene. The quantum dot may include a colloidal QD, a nanocrystal structure, or the like. The source 121 and the drain 131 may include a conductive material, and, for example, may each independently include a metal, a metal-containing compound, or a conductive polymer.

Referring to FIGS. 8 and 9, the gate electrode 300 may be arranged over the substrate 100 and spaced apart from the substrate 100, and may be arranged opposite to the channel 110 (111). The gate electrode 300 may have a conductivity greater than 0 and less than or equal to 1 mohm/square or less. The gate electrode 300 may include at least one selected from the group consisting of or including a metal, a metal nitride, a metal carbide, a polysilicon, and combinations thereof. The metal may include, for example, aluminum (Al), tungsten (W), molybdenum (Mo), titanium (Ti), or tantalum (Ta). The metal nitride may include, for example, titanium nitride (TiN) or tantalum nitride (TaN). The metal carbide may include, for example, aluminum- or silicon-doped (or aluminum- or silicon-containing) metal carbide. The metal carbide may include, for example, TiAlC, TaAlC, TiSiC, or TaSiC. The gate electrode 300 may have a structure in which a plurality of material layers are stacked. For example, the gate electrode 300 may have a stack structure of a metal nitride layer/metal layer, such as TiN/AI, or a stack structure of a metal nitride layer/metal carbide layer/metal layer, such as TIN/TiAlC/W. For example, the gate electrode 300 may include a titanium nitride film (TIN) or molybdenum (Mo). The embodiments described above may be used in various modifications. The first dielectric layer thin film 200 including the ferroelectric material described above may be arranged between the substrate 100 and the gate electrode 300. For example, the first dielectric layer thin film 200 including the ferroelectric material described above may be formed on the channel 110 (111).

Figure 10:
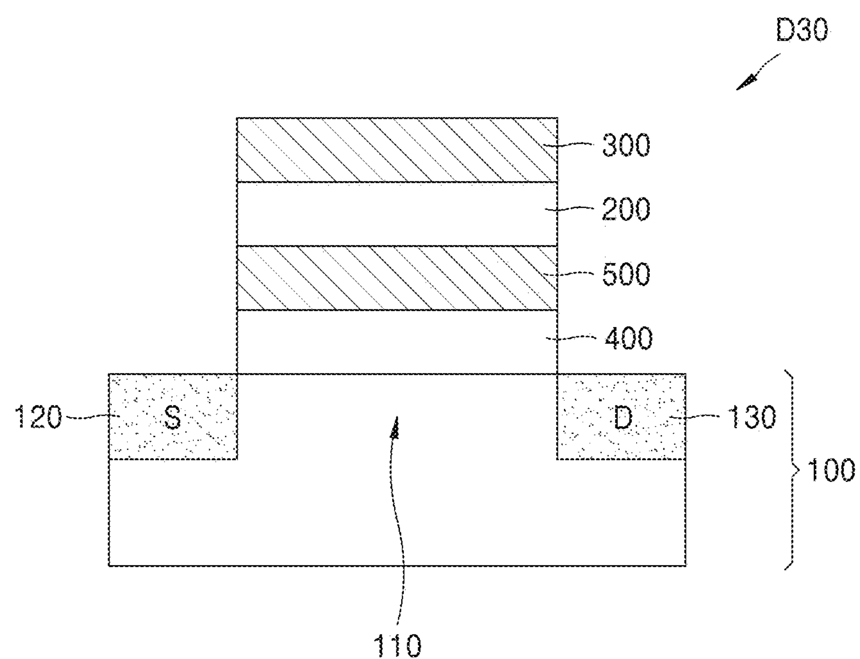
FIG. 10 is a schematic view showing a semiconductor device according to some example embodiments.

FIG. 10 is a schematic view showing a semiconductor device D30 according to some example embodiments.

Referring to FIG. 10, a second dielectric layer 400 may be further included between the channel 110 and the first dielectric layer thin film 200 including the ferroelectric material. The second dielectric layer 400 may suppress or prevent electrical leakage. A thickness of the second dielectric layer 400 may be, for example, about 0.1 nm to about 100 nm, about 0.1 nm to about 50 nm, about 0.1 nm to about 30 nm, about 0.5 nm to about 10 nm, about 1 nm to about 5 nm, about 1 nm to about 4 nm, about 1 nm to about 3 nm, or about 1 nm to about 2 nm. The second dielectric layer 400 may include a paraelectric material or a high-dielectric material. The second dielectric layer 400 may include, for example, silicon oxide, silicon nitride, aluminum oxide, hafnium oxide, zirconium oxide, or the like. The second dielectric layer 400 may include, for example, a two-dimensional (2D) insulator such as hexagonal boron nitride (h-BN). For example, the second dielectric layer 400 may include silicon oxide ($SiO_2$), silicon nitride (SiNx), or the like. The second dielectric layer 400 may include, for example, one or more of hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), or the like. The second dielectric layer 400 may include, for example, a metal oxynitride such as aluminum oxynitride (AlON), zirconium oxynitride (ZrON), hafnium oxynitride (HfON), lanthanum oxynitride (LaON), yttrium oxynitride (YON), or the like. The second dielectric layer 400 may include, for example, a silicate such as ZrSiON, HfSiON, YsiON, LaSiON, or the like. The second dielectric layer 400 may include, for example, an aluminate such as one or more of ZrAlON, HfAlON, or the like.

Referring to FIG. 10, a conductive layer 500 may be further arranged between the channel 110 and the first dielectric layer thin film 200 including the ferroelectric material. The conductive layer 500 may have a conductivity greater than 0 and less than or equal to 1 mohm/square. The conductive layer 500 may be, for example, a floating electrode. The conductive layer 500 may be formed of, for example, a metal or a metal-containing compound.

The semiconductor device may be implemented as a field-effect transistor (FET) in various forms, such as a two-dimensional or three-dimensional form. For example, the FET may have: a 1-gate on channel form, like a planar-FET; a 3-gate on channel form, like a Fin-FET; or a 4-gate on channel form, like a gate-all-around-FET.

Figure 11:
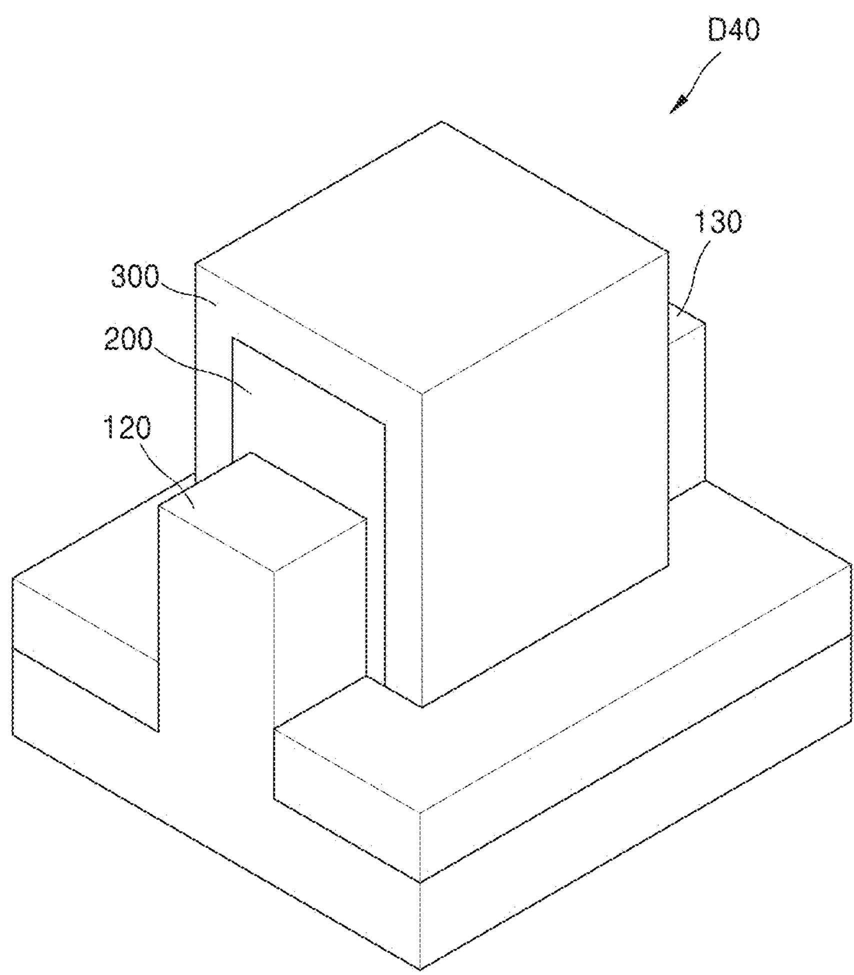
FIG. 11 is a schematic view showing a structure of a Fin-FET as a semiconductor device according to some example embodiments.

FIG. 11 is a schematic view showing a structure of a Fin-FET as a semiconductor device according to another embodiment.

Referring to FIG. 11, the Fin-FET D40 may include a source 120, a drain 130, and a channel (not shown) defined between the source S and the drain D, and the channel may have a fin shape. The gate electrode 300 may be arranged on a substrate including a fin shape, to cross the fin shape. The channel may be formed in a region in which the fin shape and the gate electrode 300 cross each other. The first dielectric layer thin film 200 including the ferroelectric material is arranged between the channel and the gate electrode 300 while surrounding the channel and contacting the source 120 and the drain 130.

Figure 12:
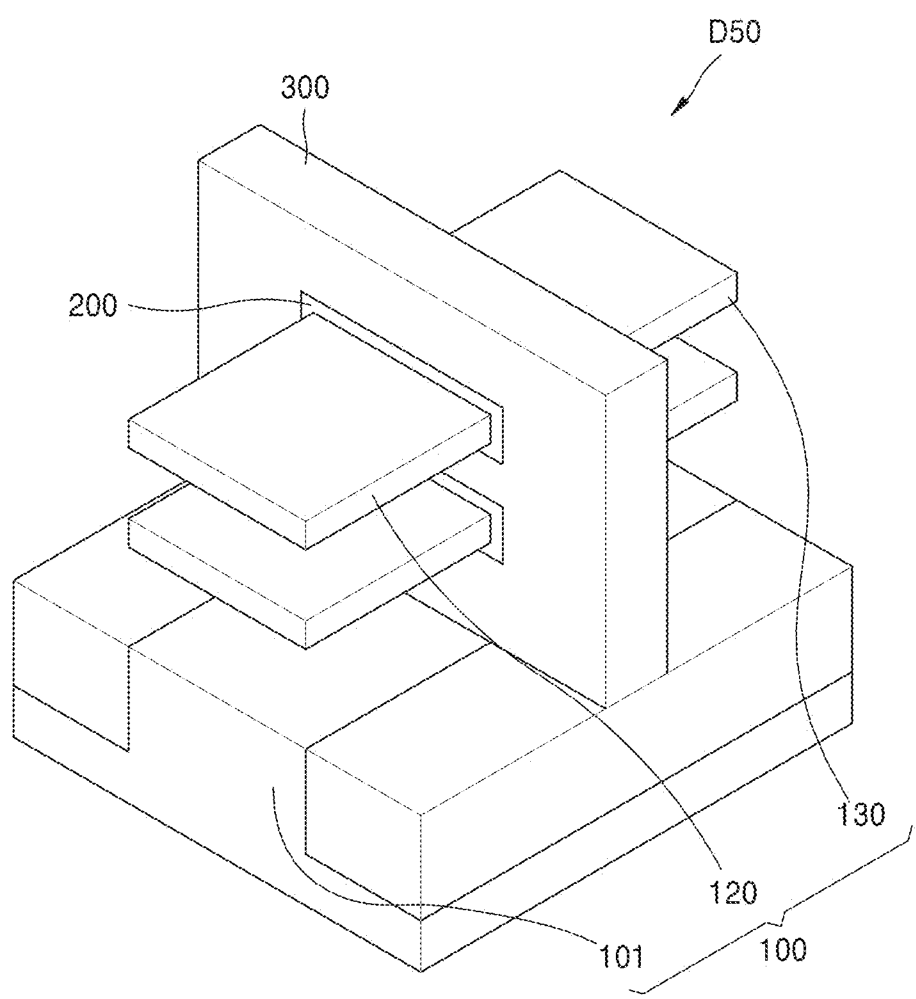
FIG. 12 is a schematic view showing a structure of a gate-all-around-FET as a semiconductor device according to some example embodiments.

FIG. 12 is a schematic view showing a structure of a gate-all-around-FET as a semiconductor device according to another embodiment.

Referring to FIG. 12, a gate-all-around-FET D50 may include a source 120, a drain 130, and a channel (not shown) defined as a region therebetween, and the channel may have a form of wire, sheet, or the like. The source 120, the drain 130, and the channel may be arranged to be spaced apart from a substrate region 101. A gate electrode 300 may be arranged to cross and surround the source 120, the drain 130, and the channel. The channel may be formed in a region surrounded by the gate electrode 300. The first dielectric layer thin film 200 including the ferroelectric material may be arranged between the channel and the gate electrode 300 to surround the channel. The gate-all-around-FET D50 may be a multi-bridge channel FET (MBCFET™); however, example embodiments are not limited thereto.

For example, the electronic device may be a capacitor including: a thin-film dielectric layer including the ferroelectric material described above; and a thin-film electrode layer arranged on both surfaces of the thin-film dielectric layer.

Figure 13:
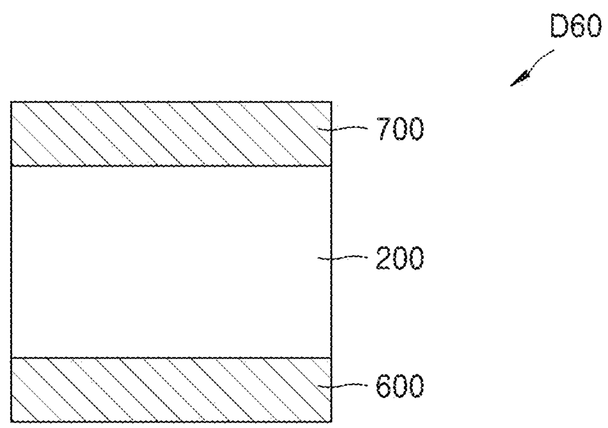
FIG. 13 is a schematic view showing a capacitor according to some example embodiments.

FIG. 13 is a schematic view showing a capacitor according to some example embodiments.

Referring to FIG. 13, a capacitor D60 may include a first electrode 600, a second electrode 700 arranged to face and be spaced apart from the first electrode 600, and the first dielectric layer thin film 200 which includes the ferroelectric material and is arranged between the first electrode 600 and the second electrode 700. The first electrode 600 and the second electrode 700 may be referred to as a lower electrode and an upper electrode, respectively.

The first electrode 600 and the second electrode 700 may have a conductivity of greater than 0 and less than or equal to 1 mohm/square. The first electrode and the second electrode may consist of or may include the same material or different materials. The first electrode 600 and the second electrode 700 may each independently include or together include one or more of TiN, TaN, Ti, Ta, TiCN, TiSiN, WSiN, TiAlN, TaAlN, TiAlCN, TiW, RuTiN, RuCN, Pt, Au, Mo, or Al. The first electrode 600 and the second electrode 700 may each independently include TiN or Mo. The first electrode 600 and the second electrode 700 may each independently or together have a thickness of about 1 nm to about 20 nm.

For example, the electronic device may include: a semiconductor substrate including a source and a drain; a gate electrode arranged on the semiconductor substrate; and the first dielectric layer thin film arranged between the semiconductor substrate and the gate electrode, and may further include a capacitor. The capacitor may further include: the first dielectric layer thin film described above; and a first thin-film electrode layer and a second thin-film electrode layer which are arranged on both surfaces of the first dielectric layer thin film, respectively, and the capacitor may be arranged on or buried in the semiconductor substrate.

The electronic device may be, for example, a semiconductor device. The semiconductor device may have a form in which a plurality of semiconductor devices are connected. For example, the semiconductor device may have a form in which an FET and a capacitor are electrically connected. For example, the semiconductor device may have memory properties, and may be, for example, a DRAM.

Figure 14:
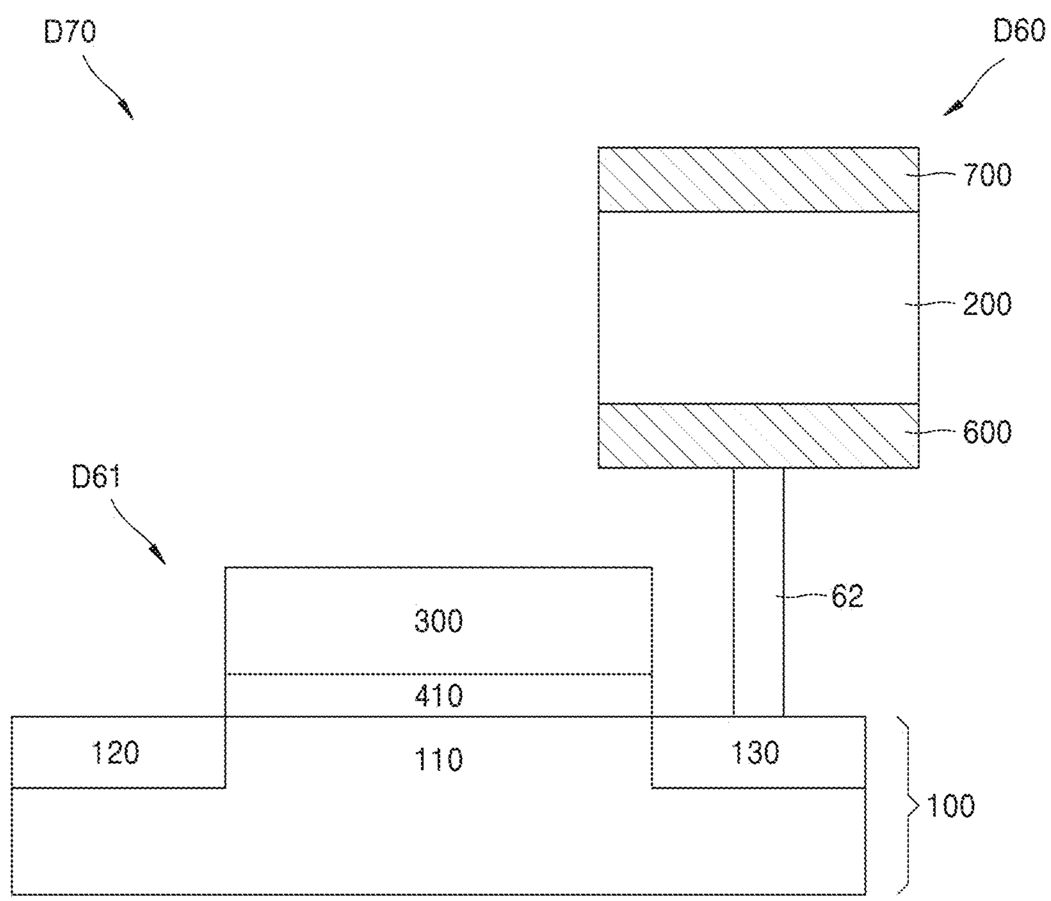
FIG. 14 is a schematic view showing a structure of a semiconductor device according to another embodiment, e.g., a connection structure of a capacitor and an FET.

FIG. 14 is a schematic view showing a structure of a semiconductor device according to various example embodiments, e.g., a connection structure of a capacitor and an FET.

Referring to FIG. 14, a semiconductor device D70 has a structure in which the capacitor D60, which includes the first dielectric layer thin film 200 including the ferroelectric material described above, and a FET D61 are electrically connected by a contact 62. One of the first and second electrodes 600 and 700 of the capacitor D60 is electrically connected to one of a source 120 and a drain 130 of the FET D61 by the contact 62. The contact 62 may include an appropriate conductive material, for example, one or more of tungsten, copper, aluminum, polysilicon, or the like.

The FET D61 may include: a substrate 100 including the source 120, the drain 130, and a channel 110; and the gate electrode 300 arranged to face the channel 110. A second dielectric layer 410 may be further included between the substrate 100 and the gate electrode 300. Although the FET D61 of FIG. 12 is illustrated as an example which does not include the second dielectric layer thin film 200 including the ferroelectric material, the FET D61 may include the second dielectric layer thin film 200 including the ferroelectric material. For the source 120, the drain 130, the channel 110, the substrate 100, and the gate electrode 300, the description of the transistor (FET) provided above may be referred to. For the second dielectric layer 410, the description of the second dielectric layer 400 provided above may be referred to. Although not illustrated, the positions of the capacitor D60 and the FET D61 may be variously changed. For example, the capacitor D60 may be arranged on the substrate 100 or may be buried in the substrate 100.

Figure 15:
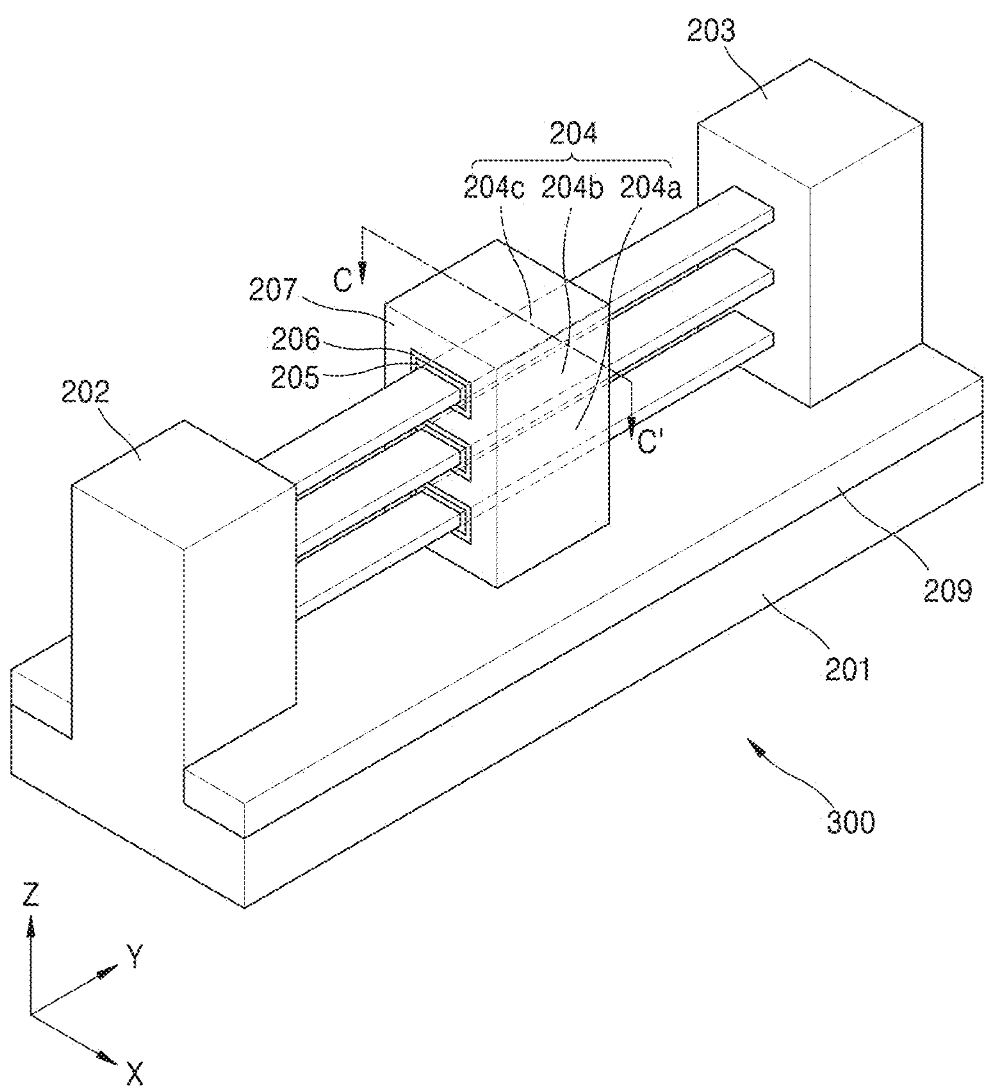
FIG. 15 is a schematic cross-sectional view illustrating a structure of an electronic device according to some example embodiments.

FIG. 15 is a schematic cross-sectional view illustrating a structure of an electronic device 300 according to some example embodiments. Referring to FIG. 15, the electronic device 300 includes a substrate 201, a first source/drain region 202 protruding in the Z-direction from an upper surface of the substrate 201, a second source/drain region 203 protruding in the Z-direction from the upper surface of the substrate 201, a channel 204 separated from the upper surface of the substrate 201 and having a bar shape extending in the Y-direction, an interfacial insulating layer 205 surrounding and covering the channel 204, a ferroelectric layer 206 surrounding and covering the interfacial insulating layer 205, and a gate electrode 207 surrounding and covering the ferroelectric layer 206. The ferroelectric layer 206 may be a ferroelectric thin film structure 150 or 154 which are included in the above described electronic device 100, 101, 102, 103, 104 or 015. The channel 204 may include a plurality of channel elements 204*a*, 204*b*, 204*c* disposed at a distance from each other in the Z-direction or an X direction that is different from the Y-direction. In FIG. 15, although the three channel elements 204*a*, 204*b*, and 204*c* are illustrated as being separated from each other in the Z-direction, this is merely an example and is not necessarily limited thereto. The electronic device 300 illustrated in FIG. 15 may be, for example, a GAAFET or an MBCFET™.

Figure 16:
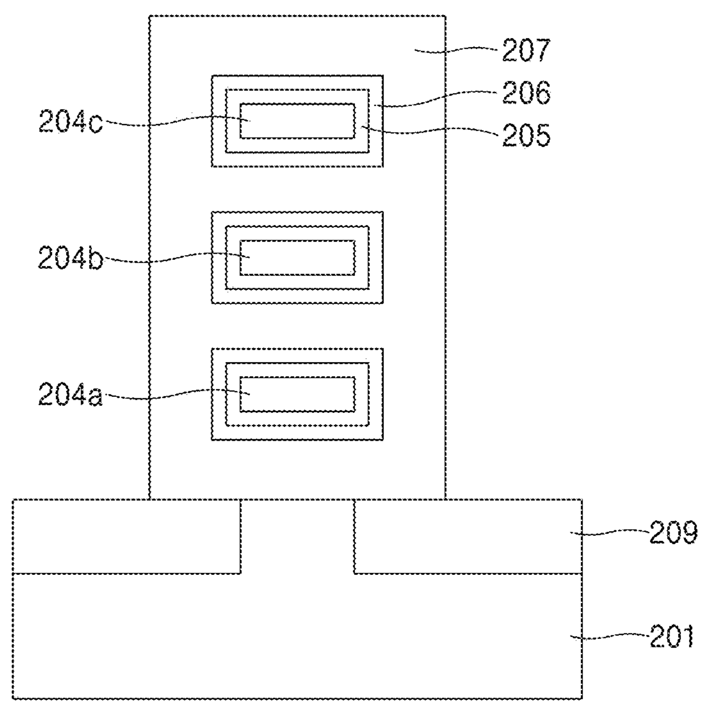
FIG. 16 is a schematic cross-sectional view showing a gate structure of the electronic device shown in FIG. 15.

FIG. 16 is a schematic cross-sectional view showing a gate structure of the electronic device 300 shown in FIG. 15, and in particular, a cross-sectional view taken along line C-C' of the gate structure. Referring to FIG. 16, the semiconductor device 300 may include a plurality of interfacial insulating layers 205 disposed to respectively surround four surfaces of the plurality of channel elements 204*a*, 204*b*, and 204*c*. Also, the electronic device 300 may include a plurality of ferroelectric layers 206 disposed to respectively surround four surfaces of the plurality of interfacial insulating layers 205. The gate electrode 207 may have a structure extending in the Z-direction by protruding from an upper surface of the substrate 201 to surround four surfaces of each of the plurality of ferroelectric layers 206.

Figure 17:
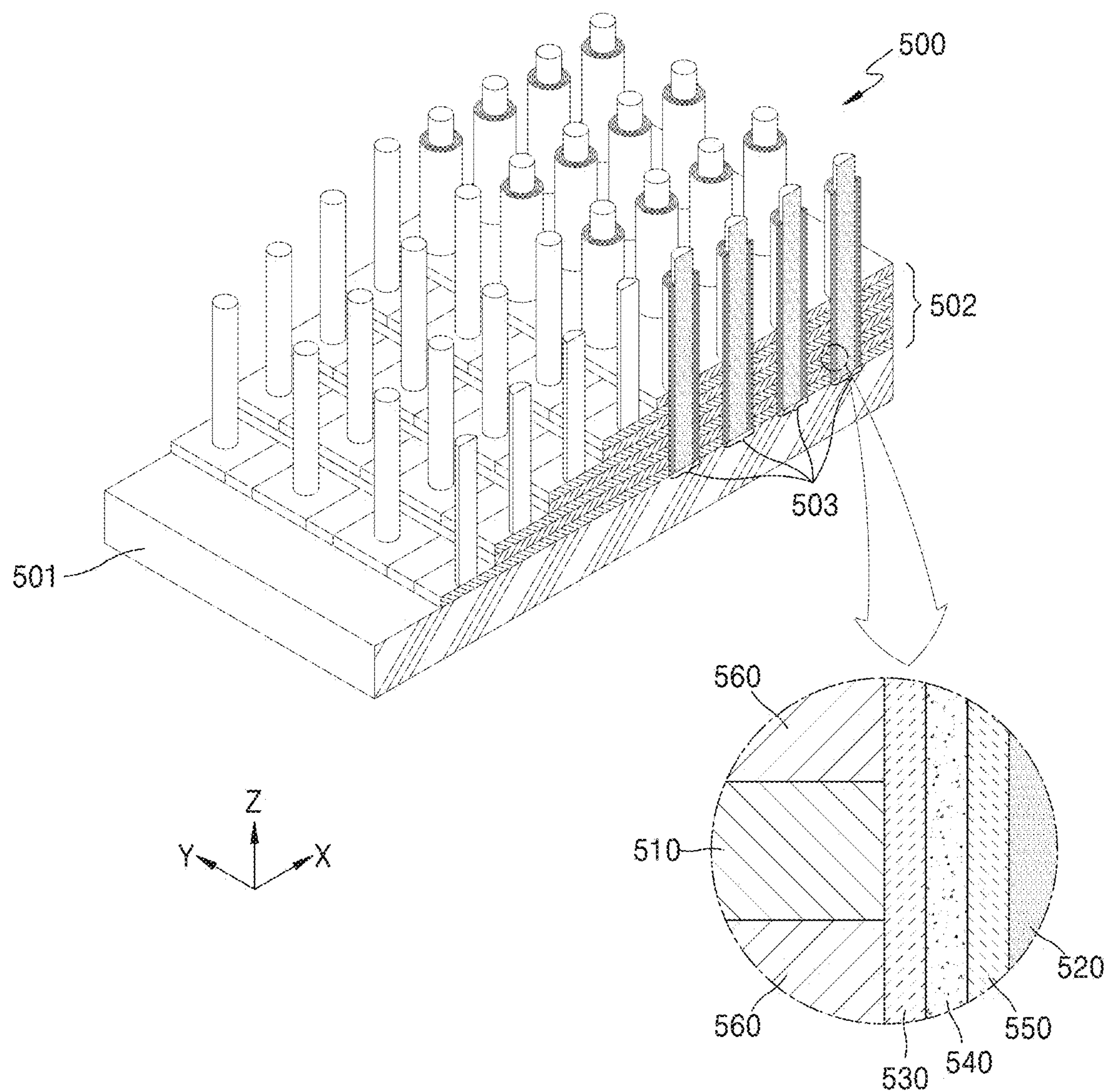
FIG. 17 is a schematic view of an electronic device according to some example embodiments.

FIG. 17 is a schematic view of an electronic device according to some example embodiments.

Referring to FIG. 17, an electronic device 500 may have a stack structure 502 in which a plurality of insulating layers 560 and a plurality of gate electrodes 510 are alternately and repeatedly stacked, and the ferroelectric layer 530, the interfacial layer 540, the channel 550, and the dielectric filler 520 may be arranged to penetrate the stack structure 502. The ferroelectric layer 530 may be a ferroelectric thin film structure 150 or 154 which are included in the above described electronic device 100, 101, 102, 103, 104 or 015. In detail, the insulating layers 560 and the gate electrodes 510 each may extend on the substrate 501 along an X-Y plane, and the insulating layers 560 and the gate electrodes 510 are alternately and repeatedly stacked in the Z direction (e.g., vertical direction), thereby forming the stack structure 502. Furthermore, the electronic device 500 may include a cell string 503 that includes the ferroelectric layer 530, the interfacial layer 540, the channel 550, and the dielectric filler 520, and the cell string 503 may be arranged to penetrate the stack structure 502 (e.g., in the Z direction, or vertical direction). In other words, the insulating layers 560 and the gate electrodes 510 may be arranged to surround the periphery of the cell string 503. In detail, the ferroelectric layer 530, the interfacial layer 540, the channel 550, and the dielectric filler 520 all may extend in the Z direction through the stack structure to intersect the insulating layers 560 and the gate electrodes 510. Furthermore, the dielectric filler 520 may be arranged in the center of the cell string 503, and the ferroelectric layer 530, the interfacial layer 540, and the channel 550 may be arranged to surround (e.g., concentrically surround as shown in FIG. 17) the dielectric filler 520. The interfacial layer 540 may be arranged between the ferroelectric layer 530 and the channel 550. The interfacial layer 540 may be an insulating layer. The electronic device 500 may include a plurality of cell strings as the cell string 503, and the cell strings 503 may be arranged spaced apart from each other (e.g., isolated from direct contact with each other) on the X-Y plane (e.g., plane of the stack structure) in a two dimension (e.g., along a plane of the stack structure as shown in FIG. 17, wherein the vertical direction or Z direction is perpendicular to the plane of the stack structure, or X-Y plane).

Figure 18:
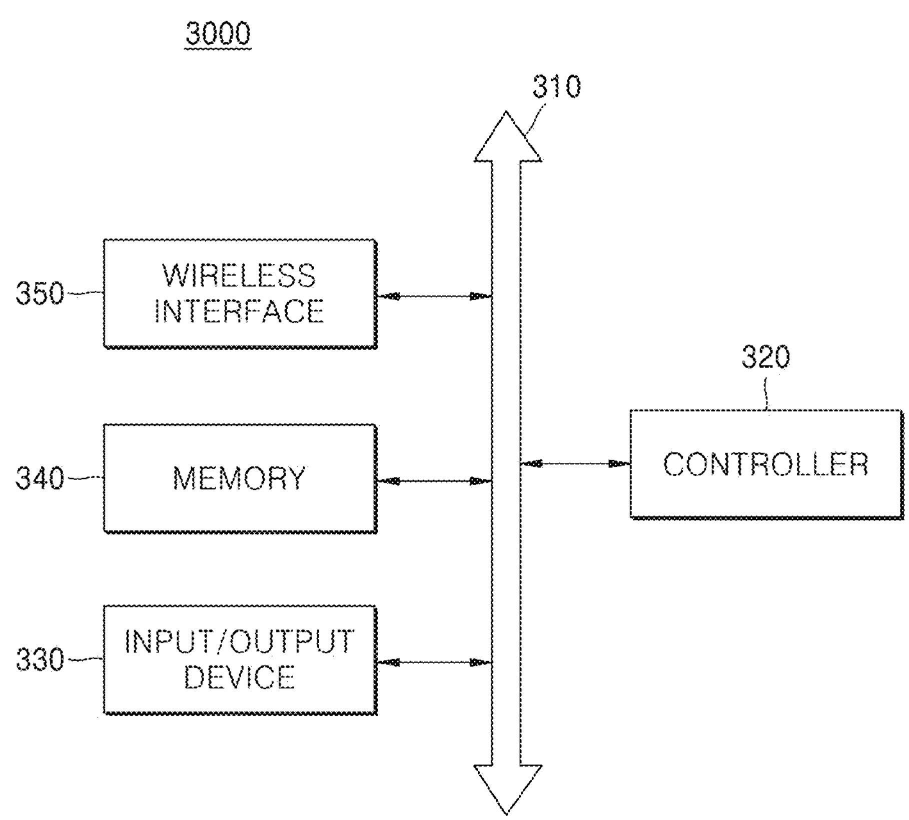
FIG. 18 is a schematic illustration of an electronic device, according to some example embodiments.

FIG. 18 is a block diagram schematically illustrating an electronic device 3000 according to some example embodiments.

Referring to FIG. 18, the electronic device 3000 according to some example embodiments may include a PDA, a laptop computer, a portable computer, a web tablet, a wireless phone, a mobile phone, a digital music player, a wired/wireless electronic device, or a composite electronic device including at least two of the devices described above. The electronic device 3000 may include at least one of a controller 320, an input/output device 330, such as a keypad, a keyboard, and a display, a memory 340, and a wireless interface 350 combined to each other through a bus 310, and may include at least one active or passive circuit component.

Any one or more of the components illustrated in FIG. 18 may include a ferroelectric material, such as the ferroelectric materials described above with reference to FIGS. 1-7. For example, any one or more of the components illustrated in FIG. 18 may include the ferroelectric material implemented as one or more of the transistors D10-D50 and/or capacitor D6 and/or semiconductor device D70 illustrated above. Any one or more of the components illustrated in FIG. 18 may also include one or more active or passive component.

The controller 320 may include, for example, one or more microprocessors, digital signal processors, microcontrollers, or the like. The memory 340 may be used, for example, to store instructions to be executed by controller 320.

The memory 340 may be used to store user data. The memory 340 may include a magnetic tunneling junction device, and may include a nonvolatile memory device.

The electronic device 3000 may use the wireless interface 350 to transmit data to or receive data from a wireless communication network that communicates with an RF signal. For example, the air interface 350 may include at least one of an antenna, a wireless transceiver, and the like. The electronic device 3000 may be used in a communication interface protocol like a 3G communication system, such as at least one of a Code-division multiple access (CDMA), Global System for Mobiles (GSM), north American digital cellular (NADC), Enhanced-time-division multiple-access (E-TDMA), Wideband Code Division Multiple Access (WCDAM), or CDMA2000.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

As described above, according to the one or more example embodiments, a ferroelectric material includes a structural layer having a novel symmetric structure at the domain wall, and thus, the energy barrier when domain inversion occurs in the ferroelectric material may reduce.

It should be understood that various example embodiments described herein should be considered in a descriptive sense only and not for purposes of limitation. Descriptions of features or aspects within various example embodiments should typically be considered as available for other similar features or aspects in other embodiments; for example, example embodiments are not necessarily mutually exclusive. While one or more embodiments have been described with reference to the figures, it will be understood by those of ordinary skill in the art that various changes in form and details may be made therein without departing from the spirit and scope as defined by the following claims.

What is claimed is:

1. A ferroelectric material comprising:
- a first domain including a first polarization layer configured to be polarized in a first direction and a first spacer layer adjacent to the first polarization layer;
- a second domain including a second polarization layer configured to be polarized in a second direction distinct from the first direction and a second spacer layer adjacent to the second polarization layer; and
- a structural layer at a domain wall between the first domain and the second domain, the structural layer having an orthorhombic crystal structure.

2. The ferroelectric material of claim 1, wherein the structural layer is arranged as a Pbcn space group.

3. The ferroelectric material of claim 1, wherein the structural layer comprises at least a portion of the first polarization layer and at least a portion of the second polarization layer.

4. The ferroelectric material of claim 3, wherein the first spacer layer and the second spacer layer are not present between the first polarization layer and the second polarization layer in the structural layer.

5. The ferroelectric material of claim 1, wherein the ferroelectric material includes a compound having a fluorite structure.

6. The ferroelectric material of claim 1, wherein the first polarization layer includes four oxygen atoms and two metal atoms, and the four oxygen atoms and the two metal atoms have non-symmetry in a polar C-axis direction, and
- the first direction is one of two directions parallel to the polar C-axis direction.

7. The ferroelectric material of claim 1, wherein the second polarization layer includes four oxygen atoms and two metal atoms, and the four oxygen atoms and the two metal atoms have non-symmetry in a polar C-axis direction, and
- the second direction is a direction opposite to the first direction which is one of two directions parallel to the polar C-axis direction.

8. The ferroelectric material of claim 1, wherein the first spacer layer is a non-polarizable layer, the first spacer layer includes four oxygen atoms and two metal atoms, and the four oxygen atoms and the two metal atoms have symmetry in a polar C-axis direction.

9. The ferroelectric material of claim 1, wherein the first domain comprises a plurality of first polarization layers and a plurality of first spacer layers between the plurality of first polarization layers, and
- the second domain comprises a plurality of second polarization layers and a plurality of second spacer layers disposed between the plurality of second polarization layers.

10. The ferroelectric material of claim 9, wherein the plurality of first polarization layers included in the first domain are configured to be polarized in the first direction, and the plurality of second polarization layers included in the second domain are configured to be polarized in the second direction.

11. The ferroelectric material of claim 1, wherein the first polarization layer and the second polarization layer have a same chirality.

12. The ferroelectric material of claim 1, wherein a strain applied to the structural layer is about −1% to about 1%.

13. The ferroelectric material of claim 1, wherein the first domain and the second domain each independently include at least one crystalline phase selected from an orthorhombic crystalline phase, a tetragonal crystalline phase, and a cubic crystalline phase.

14. The ferroelectric material of claim 13, wherein the orthorhombic crystalline phase is arranged as a Pca21 space group, the tetragonal crystalline phase is arranged as a $P4_2/nmc$ space group, and the cubic crystalline phase is arranged as a Fm-3m space group.

15. The ferroelectric material of claim 1, wherein an amount of the structural layer is greater than 0 vol % and less than or equal to about 40 vol % with respect to a total volume of the ferroelectric material.

16. The ferroelectric material of claim 1, wherein the ferroelectric material comprises a binary metal oxide represented by Formula 1:

$MO_2$ <Formula 1> wherein, in Formula 1, M is an element which belongs to Group IV of the periodic table of the elements.

17. The ferroelectric material of claim 16, wherein M is Hf or Zr.

18. The ferroelectric material of claim 16, wherein the binary metal oxide comprises a dopant.

19. The ferroelectric material of claim 18, wherein the dopant is at least one selected from C, Si, Ge, Sn, Pb, Al, Y, La, Gd, Mg, Ca, Sr Ba, and Ti.

20. The ferroelectric material of claim 1, wherein the ferroelectric material comprises a binary metal oxide represented by Formula 2 or 3:

$Hf_{1-x}D_xO_2$ <Formula 2>

$Zr_{1-x}D_xO_2$ <Formula 3> wherein, in Formulae 2 and 3,

D is at least one selected from C, Si, Ge, Sn, Pb, Al, Y, La, Gd, Mg, Ca, Sr Ba, and Ti, and $0 \leq x \leq 0.15$.

21. An electronic device comprising a thin-film dielectric layer, wherein the thin-film dielectric layer comprises the ferroelectric material according to claim 1.

22. The electronic device of claim 21, wherein the thin-film dielectric layer has a thickness of about 0.1 nm to about 50 nm.

23. The electronic device of claim 21, wherein a current versus time profile in response to polarization switching occurring due to application of a voltage to the thin-film dielectric layer has a peak in a range of greater than 0 and less than or equal to $5\times10^{-7}$ sec.

24. The electronic device of claim 21, further comprising: a thin-film electrode layer, wherein the thin-film dielectric layer is arranged on a surface or both surfaces of the thin-film electrode layer.

25. The electronic device of claim 24, wherein the thin-film electrode layer has a thickness of about 10 nm to about 1000 nm.

26. The electronic device of claim 24, wherein the thin-film electrode layer comprises at least one selected from a metal, an oxide of the metal, a doped oxide of the metal, a nitride of the metal, and a carbide of the metal.

27. The electronic device of claim 26, wherein a metal included in the thin-film electrode layer comprises at least one selected from Ti, W, Ta, Co, Mo, Ni, V, Hf, Al, Cu, Pt, Pd, Ir, Au, and Ru, the oxide of the metal comprises at least one selected from $RuO_2$, $IrO_2$, $PtO_2$, $MnO_2$, $Sb_2O_3$, and $In_2O_3$, the doped oxide of the metal comprises at least one selected from a Ta-doped $SnO_2$, a Ti-doped $In_2O_3$, a Ni-doped $SnO_2$, a Sb-doped $SnO_2$, and an Al-doped ZnO, and the nitride of the metal comprises at least one selected from TiN, WN, TaN, TiAlN, TaSiN, TiSiN, WSiN, TiCN, TiAlCN, RuCN, and RuTiN.

28. The electronic device of claim 21, wherein the electronic device is at least one of a capacitor, a transistor, or a memory cell.

29. The electronic device of claim 21, further comprising:

a semiconductor substrate including a source and a drain; and a gate electrode arranged on the semiconductor substrate, wherein the thin-film dielectric layer is between the semiconductor substrate and the gate electrode.

30. The electronic device of claim 29, further comprising: an insulating layer arranged between the thin-film dielectric layer and the semiconductor substrate.

31. The electronic device of claim 29, further comprising a capacitor, wherein the capacitor comprises:

the thin-film dielectric layer; and a first thin-film electrode layer and a second thin-film electrode layer on both surfaces of the thin-film dielectric layer, respectively, and the capacitor is on the semiconductor substrate or is buried in the semiconductor substrate.

32. A ferroelectric material comprising:

a first domain including a first polarization layer configured to be polarized in a first direction and a spacer layer adjacent to the first polarization layer; and a structural layer at a domain wall between the first domain and a second domain, the structural layer having metal atoms and oxygen atoms, the metal atoms and the oxygen atoms arranged as a Pbcn space group.

33. The ferroelectric material of claim 32, wherein the oxygen atoms included in a unit cell of the structural layer are symmetric with respect to a polar C-axis direction.

34. The ferroelectric material of claim 32, wherein other oxygen atoms included in a unit cell of the first polarization layer are not symmetric with respect to a polar C-axis direction.

35. An electronic device including:

at least one active or passive element; and the ferroelectric material of claim 32.

36. The electronic device of claim 35, wherein the ferroelectric material is included in at least one of a capacitor or a transistor.

* * * * *